US012572076B2

(12) United States Patent
Ghang et al.

(10) Patent No.: US 12,572,076 B2
(45) Date of Patent: Mar. 10, 2026

(54) PHOTORESIST UNDERLAYER COMPOSITION

(71) Applicant: ROHM AND HAAS ELECTRONIC MATERIALS KOREA LTD., Cheonan-si (KR)

(72) Inventors: Yoo-Jin Ghang, Cheonan-si (KR); Jae-Yun Ahn, Cheonan-si (KR); You Rim Shin, Cheonan-si (KR); Jung-June Lee, Cheonan-si (KR); Jae-Hwan Sim, Cheonan-si (KR)

(73) Assignee: ROHM AND HAAS ELECTRONIC MATERIALS KOREA LTD, Cheonan-si (KR)

( * ) Notice: Subject to any disclaimer, the term of this patent is extended or adjusted under 35 U.S.C. 154(b) by 691 days.

(21) Appl. No.: 17/994,652

(22) Filed: Nov. 28, 2022

(65) Prior Publication Data

US 2024/0201591 A1 Jun. 20, 2024

(51) Int. Cl.

| | |
|---|---|
| ***G03F 7/11*** | (2006.01) |
| ***C08F 220/68*** | (2006.01) |
| ***C08F 222/20*** | (2006.01) |
| ***C09D 133/16*** | (2006.01) |
| ***C09D 135/02*** | (2006.01) |

(52) U.S. Cl.

CPC .............. *G03F 7/11* (2013.01); *C08F 220/68* (2013.01); *C08F 222/20* (2013.01); *C09D 133/16* (2013.01); *C09D 135/02* (2013.01)

(58) Field of Classification Search

CPC . G03F 7/11; G03F 7/094; G03F 7/038; G03F 7/004; C08F 220/68; C08F 222/20; C08F 212/16; C08F 212/22; C09D 133/16; C09D 135/02; C08L 25/08; C08L 33/14

USPC ........................ 430/270.1, 271.1, 272.1, 311

See application file for complete search history.

(56) References Cited

U.S. PATENT DOCUMENTS

| | | | |
|---|---|---|---|
| 6,607,867 | B1 | 8/2003 | Kim et al. |
| 9,005,873 | B2 | 4/2015 | Sakamoto et al. |
| 10,025,179 | B2 | 7/2018 | Meyers et al. |
| 2010/0151381 | A1 | 6/2010 | Tachibana et al. |
| 2010/0213580 | A1 | 8/2010 | Meador et al. |
| 2018/0362752 | A1 | 12/2018 | Aquad et al. |
| 2020/0133123 | A1 | 4/2020 | Kobayashi et al. |
| 2020/0209747 | A1 | 7/2020 | Hatakeyama et al. |
| 2021/0200093 | A1 | 7/2021 | Park et al. |

FOREIGN PATENT DOCUMENTS

| | | | |
|---|---|---|---|
| JP | 2017044874 | A | 3/2017 |
| WO | 2018190088 | A1 | 10/2018 |

*Primary Examiner* — Caleen O Sullivan

(74) *Attorney, Agent, or Firm* — CANTOR COLBURN LLP

(57) ABSTRACT

A composition comprising a polymer, the polymer comprising: repeating units derived from a monomer of Formula A1, Formula A2, or Formula A3, repeating units derived from a monomer of Formula B1, Formula B2, Formula B3, or Formula B4, and repeating units derived from a monomer of Formula C1 or Formula C2, the structures of each as described herein. A coated substrate including a substrate, a photoresist underlayer formed from composition above, and a photoresist layer on the photoresist underlayer.

12 Claims, No Drawings

PHOTORESIST UNDERLAYER COMPOSITION

FIELD

The present invention relates to compositions for use in semiconductor manufacture, more specifically, compositions used in patterning process of a semiconductor, and the manufacturing of electronic devices.

BACKGROUND

Extreme ultraviolet ("EUV") lithography is one of the leading technology options to replace optical lithography for volume semiconductor manufacturing at feature sizes of less than 20 nm. The extremely short wavelength (13.4 nm) of EUV is a key enabling factor for achieving such high resolution. The overall process system concept such as scanning exposure, projection optics, mask format, and resist technology may be similar to that used for current optical lithographic technologies. A key challenge in EUV imaging, i.e., patterning, however, is resist sensitivity, e.g., the lower the sensitivity, the greater the EUV source power or a longer exposure time is needed to fully expose the resist.

An EUV photon has much higher energy than an ArF photon, at same dose, and therefore, photon density for many resists now used in EUV lithography can be 14 times lower than that of ArF lithography resulting in relatively slow photo-speeds. Moreover, the low photon density may also lead to a decrease in spatial photon uniformity resulting in relatively poor pattern resolution.

For improvement of throughput, methods for improving EUV lithographic sensitivity remains an important issue for EUV lithography. It has been shown that EUV light absorption cross-section and secondary electron generation yield are important factors for EUV sensitivity. One way to increase EUV photoresist sensitivity is to increase the absorption cross-section at 13.5 nm, which is an atomic property of the material that can be calculated theoretically using known atomic absorption cross-sections. Typical atoms that make up resist materials, such as carbon, oxygen, hydrogen, and nitrogen possess very weak absorption at 13.5 nm. A fluorine atom has slightly higher absorption and has been used in the development of a high EUV absorbing photoresist.

Iodine has remarkably high EUV light absorption cross-section as well. Iodine-containing monomers and corresponding polymers can be useful for lithographic processing. These materials have been applied primarily for resist compositions, but not underlayer compositions with the exception of the compositions described in U.S. patent application Ser. No. 17/138,069, assigned to Rohm and Haas Electronic Materials Korea LTD., which describes an underlayer composition including a crosslinkable polyester polymer and a crosslinker that includes an iodine-containing polymer.

There remains a strong interest in developing novel materials to improve upon EUV photon absorption with relatively high pattern resolution.

SUMMARY

Provided is a composition comprising a polymer, the polymer comprising: repeating units derived from a monomer of Formula A1, Formula A2, or Formula A3, Formula A1

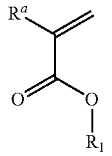

Formula A2

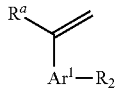

Formula A3

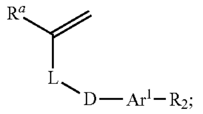

repeating units derived from a monomer of Formula B1, Formula B2, Formula B3, or Formula B4, Formula B1

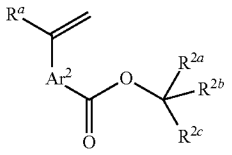

Formula B2

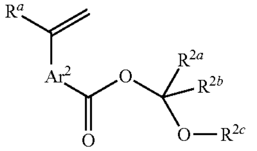

Formula B3

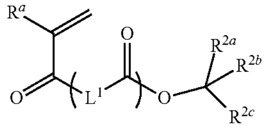

Formula B4

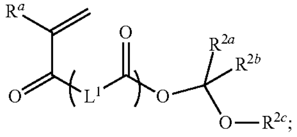

and repeating units derived from a monomer of Formula C1 or Formula C2,

Formula C1

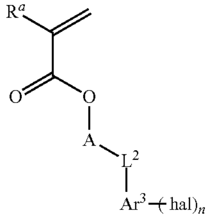

Formula C2

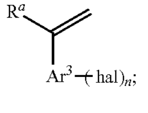

wherein $Ar^1$, $Ar^2$, and $Ar^3$ are each independently an aromatic group;

$R^1$ is a $C_{1-20}$ alkyl alcohol, a $C_{1-20}$ cycloalkyl alcohol, an epoxy with 3 to 12 carbons, or a $C_{5-20}$ aromatic group with one to six ring carbons substituted with a hydroxy, a glycidyl group, a C1-10 alkyl alcohol, or an epoxy with 3 to 12 carbons;

$R^2$ is $R^1$ or —OH;

each of $R^{2a}$, $R^{2b}$, and $R^{2c}$ is independently an unsubstituted or substituted $C_{1-20}$ alkyl, an unsubstituted or substituted $C_{3-20}$ cycloalkyl, an unsubstituted or substituted $C_{3-20}$ heterocycloalkyl, or optionally, $R^{2a}$ can join with $R^{2b}$ to form a ring, or $R^{2a}$ can join with $R^{2c}$ of Formulae B2 or B4 to form a ring, or one of $R^{2a}$, $R^{2b}$, and $R^{2c}$ is hydrogen;

L is an unsubstituted or substituted $C_{1-8}$ alkylene group or an unsubstituted or substituted $C_{2-8}$ heteroalkylene group;

$L^1$ is an unsubstituted or substituted $C_{1-8}$ alkylene group, an unsubstituted or substituted $C_{2-8}$ heteroalkylene group, an unsubstituted or substituted $C_{6-10}$ arylene group, an unsubstituted or substituted $C_{3-10}$ heteroarylene group;

$L^2$ is a single bond, —O—, —O(C═O)—, —(C═O)O—, —O($SO_2$)—, —($SO_2$)O—, —NH($SO_2$)—, —($SO_2$)NH—, —NH(C═O)—, —(C═O)NH—, —$SO_2$—, or —SO—;

D is a single bond, —O—, —OC(O)—, —NH(C═O)—, or —(C═O)NH—;

A is an unsubstituted or substituted $C_{1-16}$ alkylene group, an unsubstituted or substituted $C_{2-16}$ heteroalkylene group, an unsubstituted or substituted $C_{6-20}$ arylene group, an unsubstituted or substituted $C_{3-20}$ heteroarylene group;

each hal is independently a halogen atom or a $C_{1-4}$ haloalkyl;

$R^a$ is a hydrogen atom, a halogen atom, a $C_{1-4}$ alkyl, or a $C_{1-4}$ haloalkyl;

m is 0 or 1, and n is 1 to 12;

a crosslinker;

an acid catalyst; and a solvent.

Also provided is a coated substrate including a substrate, a photoresist underlayer formed from any one of the described compositions described above or described herein, and a photoresist layer on the photoresist underlayer Also provided is a method including:

providing a photoresist underlayer over a substrate, wherein the photoresist underlayer is formed from any one of the described compositions described above or described herein, forming a photoresist layer over the photoresist underlayer;

patterning the photoresist layer; and transferring a pattern from the patterned photoresist layer to the photoresist underlayer.

DETAILED DESCRIPTION

Reference will now be made in detail to exemplary embodiments, examples of which are illustrated in the present description. In this regard, the present exemplary embodiments may have different forms and should not be construed as being limited to the descriptions set forth herein. Accordingly, the exemplary embodiments are merely described below; by referring to the figures, to explain aspects of the present description. As used herein, the term "and/or" includes all combinations of one or more of the associated listed items. Expressions such as "at least one of," when preceding a list of elements, modify the entire list of elements and do not modify the individual elements of the list.

As used herein, the terms "a," "an," and "the" do not denote a limitation of quantity and are to be construed to cover both the singular and the plural, unless otherwise indicated herein or clearly contradicted by context. "Or" means "and/or" unless clearly indicated otherwise. All ranges disclosed herein are inclusive of the endpoints, and the endpoints are independently combinable with each other. The suffix "(s)" is intended to include both the singular and the plural of the term that it modifies, thereby including at least one of that term. "Optional" or "optionally" means that the subsequently described event or circumstance can or cannot occur, and that the description includes instances where the event occurs and instances where it does not. The terms "first," "second," and the like, herein do not denote an order, quantity, or importance, but rather are used to distinguish one element from another. When an element is referred to as being "on" another element, it may be directly in contact with the other element or intervening elements may be present therebetween. In contrast, when an element is referred to as being "directly on" another element, there are no intervening elements present. It is to be understood that the described components, elements, limitations, and/or features of aspects may be combined in any suitable manner in the various aspects.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, the term "hydrocarbon" refers to an organic compound, or an organic group, having at least one carbon atom and at least one hydrogen atom, optionally includes an aromatic group and/or one or more heteroatoms, and is optionally substituted with one or more substituents where indicated: "alkyl group" refers to a straight or branched chain saturated hydrocarbon having the specified number of carbon atoms and having a valence of one: "alkylene group" refers to an alkyl group having a valence of two; "hydroxyalkyl group" refers to an alkyl group substituted with at least one hydroxyl group (—OH); "alkoxy group" refers to "alkyl-O—"; "carboxylic acid group" refers to a group having the formula "—C(═O)—OH"; "cycloalkyl group" refers to a monovalent group having one or more saturated rings in which all ring members are carbon; "cycloalkylene group" refers to a cycloalkyl group having a valence of two; "alkenyl group" refers to a straight or branched chain, monovalent hydrocarbon group having at least one carbon-carbon double bond; "alkenoxy group" refers to "alkenyl-O—"; "alkenylene group" refers to an alkenyl group having a valence of at least two; "cycloalkenyl group" refers to a cycloalkyl group having at least one carbon-carbon double bond; "alkynyl group" refers to a monovalent hydrocarbon group having at least one carbon-carbon triple bond.

As used herein, the term “alcohol” refers to one or more hydroxy groups, e.g., two or more hydroxy groups on a stated structural moiety including a repeating unit of a polymer.

As used herein, the term “little or no crosslinking” is indicative of a polymer that is capable of crosslinking through a crosslinkable functional group positioned on a repeating unit of a polymer in which less than 10 mole percent, less than 5 mole percent, less than 2 mole percent, or 0 mole percent, of the crosslinkable functional groups present in the polymer, e.g., hydroxy or epoxy groups, are sites or points of crosslinking in the polymer prior to application of a composition including the polymer to a substrate or a layer of a structured layered material.

As used herein, the term “aromatic group” denotes the conventional idea of aromaticity as defined in the literature, in particular in IUPAC 19, and refers to a monocyclic or polycyclic aromatic ring or ring system that includes carbon atoms in the ring or rings, and optionally may include one or more heteroatoms independently selected from N, O, and S instead of a carbon atom or carbon atoms in the ring or rings. Exemplary aromatic groups can include an aromatic ring system with one to six independently substituted or unsubstituted aromatic rings. If the aromatic group includes two to six aromatic rings, then two or more aromatic rings can be connected by a single bond or a divalent linker, or two or more of the aromatic rings can be fused aromatic rings. A polycyclic aromatic ring system includes at least one ring being an aromatic hydrocarbyl group, e.g., the other rings can be a cycloalkyl, a cycloalkenyl, an aryl, a heterocycle, and/or a heteroaryl. Preferred aromatic groups are those containing six to thirty carbon atoms, six to twenty carbon atoms, or six to twelve carbon atoms. Exemplary aromatic groups include phenyl, biphenyl, triphenyl, triphenylene, tetraphenylene, naphthalene, anthracene, phenalene, phenanthrene, fluorene, pyrene, chrysene, perylene, and azulene. Exemplary aromatic groups that include one or more heteroatoms include dibenzothiophene, dibenzofuran, furan, thiophene, benzofuran, benzothiophene, carbazole, indolocarbazole, pyridylindole, pyrazole, imidazole, triazole, pyridine, pyridazine, pyrimidine, pyrazine, triazine, indole, benzimidazole, quinoline, isoquinoline, cinnoline, quinazoline, quinoxaline, or xanthene.

As used herein, the term “aryl group” refers to a monovalent, monocyclic or polycyclic aromatic group containing only carbon atoms in the aromatic ring or rings, and may include a group with an aromatic ring fused to at least one cycloalkyl or heterocycloalkyl ring; “arylene group” refers to an aryl group having a valence of at least two; “alkylaryl group” refers to an aryl group that has been substituted with an alkyl group; “arylalkyl group” refers to an alkyl group that has been substituted with an aryl group; “aryloxy group” refers to “aryl-O—”; and “arylthio group” refers to “aryl-S—”.

The prefix “hetero” means that the compound or group includes at least one member that is a heteroatom (e.g., 1, 2, 3, or 4 or more heteroatom(s)) instead of a carbon atom, wherein the heteroatom(s) is each independently selected from N, O, S, Si, or P; “heteroatom-containing group” refers to a substituent group that includes at least one heteroatom; “heteroalkyl group” refers to an alkyl group having 1-4 heteroatoms instead of carbon atoms; “heterocycloalkyl group” refers to a cycloalkyl group with one or more N, O or S atoms instead of carbon atoms; “heterocycloalkylene group” refers to a heterocycloalkyl group having a valence of at least two; “heteroaryl group” refers to an aryl group having 1 to 3 separate or fused rings with one or more N, O or S atoms as ring members instead of carbon atoms: and “heteroarylene group” refers to a heteroaryl group having a valence of at least two.

The symbol “*” represents a bonding site (i.e., point of attachment).

“Substituted” or “substituent group” means that at least one hydrogen atom on the group is replaced with another group, provided that the designated atom’s normal valence is not exceeded. When the substituent is oxo (i.e., =O), then two hydrogens on the carbon atom are replaced. Combinations of two or more substituents or variables are permissible. For example, the term “substituted” may refer to the stated hydrocarbon moiety with two, three, or four of the same or different substituent groups. Exemplary groups that may be present on a “substituted” position include, but are not limited to, nitro ($—NO_2$), cyano (—CN), hydroxyl (—OH), oxo (=O), amino ($—NH_2$), mono- or di-($C_{1-6}$) alkylamino, alkanoyl (such as a $C_{2-6}$ alkanoyl group such as acyl), formyl (—C(—O)H), carboxylic acid or an alkali metal or ammonium salt thereof, $C_{2-6}$ alkyl ester (—C(=O) O-alkyl or —OC(=O)—alkyl), $C_{7-13}$ aryl ester (—C(=O) O-aryl or —OC(—O)—aryl), amido ($—C(=O)NR_2$ wherein R is hydrogen or $C_{1-6}$ alkyl), carboxamido ($—CH_2C(=O)NR_2$ wherein R is hydrogen or $C_{1-6}$ alkyl), halogen, thiol (—SH), $C_{1-6}$ alkylthio (—S—alkyl), thiocyano (—SCN), $C_{1-6}$ alkyl, $C_{2-6}$ alkenyl, $C_{2-6}$ alkynyl, $C_{1-6}$ haloalkyl, $C_{1-9}$ alkoxy, $C_{1-6}$ haloalkoxy, $C_{3-12}$ cycloalkyl, $C_{5-18}$ cycloalkenyl, $C_{6-12}$ aryl having at least one aromatic ring (e.g., phenyl, biphenyl, naphthyl, or the like, each ring either substituted or unsubstituted aromatic), $C_{7-19}$ arylalkyl having 1 to 3 separate or fused rings and from 6 to 18 ring carbon atoms, arylalkoxy having 1 to 3 separate or fused rings and from 6 to 18 ring carbon atoms, $C_{7-12}$ alkylaryl, $C_{4-12}$ heterocycloalkyl, $C_{3-12}$ heteroaryl, $C_{1-6}$ alkyl sulfonyl ($—S(=O)_2$-alkyl), $C_{6-12}$ arylsulfonyl ($—S(=O)_2$-aryl), or tosyl ($CH_3C_6H_4SO_2—$). When a group is substituted, the indicated number of carbon atoms is the total number of carbon atoms in the group, excluding those of any substituents. For example, the group $—CH_2CH_2CN$ is a $C_2$ alkyl group substituted with a cyano group.

As used herein, the terms “polymer” and “polymeric” refer to a polymeric material that includes one or more repeating units, where the repeating units may be the same or different from each other. Thus, the disclosed polymers and polymeric materials of the invention can be referred to herein as a “polymer” or a “copolymer.” It is to be further understand that the terms “polymer” and “polymeric” further include oligomers. As used herein, each of the one or more different repeating units are present in the polymeric material at least two times. In other words, a polymeric material including one repeating unit includes a first repeating unit that is present in an amount of two or more, and, for example, a polymeric material including at least two different repeating units, e.g., a first repeating unit, and a second repeating unit, with each of the first and the second repeating units present in an amount of two or more.

As used herein, when a definition is not otherwise provided, a “divalent linker” refers to a divalent group including one or more of —O—, —S—, —Te—, —Se—, —C(O)—, $—N(R^N)—$, $—C(O)NR^N—$, —S(O)—, $—S(O)_2—$, —C(S)—, —C(Te)—, —C(Se)—, substituted or unsubstituted $C_{1-16}$ alkylene, substituted or unsubstituted C3-16 cycloalkylene, substituted or unsubstituted $C_{1-16}$ heterocycloalkylene, substituted or unsubstituted $C_{6-20}$ arylene, substituted or unsubstituted $C_{7-30}$ arylalkylene, substituted or unsubstituted $C_{3-20}$ heteroarylene, substituted or unsubstituted $C_{3-30}$ heteroarylalkylene, or a combination thereof, wherein $R^N$ is hydrogen, substituted or unsubstituted $C_{1-8}$ alkyl, substituted or unsubstituted $C_{1-8}$ heteroalkyl, substituted or unsubstituted $C_{6-14}$ aryl, or substituted or unsubstituted $C_{3-14}$ heteroaryl. More typically, the divalent linking group includes one or more of —O—, —S—, —C(O)—, —N($R^N$)—, —S(O)—, —$S(O)_2$—, substituted or unsubstituted $C_{1-10}$ alkylene, substituted or unsubstituted $C_{3-10}$ cycloalkylene, substituted or unsubstituted $C_{1-10}$ heterocycloalkylene, substituted or unsubstituted $C_{6-12}$ arylene, substituted or unsubstituted $C_{7-20}$ arylalkylene, substituted or unsubstituted $C_{3-12}$ heteroarylene, substituted or unsubstituted $C_{3-20}$ heteroarylalkylene, or a combination thereof.

More recently, as specification demands ever-smaller resolution patterns, pattern collapse remains as one of the more challenging issues in EUV lithography. One way to reduce or minimize pattern collapse is to enhance the adhesion between the resist and an underlayer or substrate.

We describe a polymeric photoresist underlayer composition to provide a photoresist underlayer in the patterning or making of a semiconductor. The photoresist underlayer polymer includes three or more different repeating units to enhance EUV photon absorption cross-section of the underlayer as well as improve upon adhesion of the underlayer to the underlying layer or substrate. The described polymeric photoresist underlayer seeks to provide improved (faster) photo-speed, high resolution, and/or collapse margin improvement.

In an embodiment, we provide a composition that may be applied to an underlayer or substrate to form a film layer over a substrate, that is, as a photoresist underlayer. The composition includes a polymer, and the polymer comprises:

repeating units derived from a monomer of Formula A1, Formula A2, or Formula A3, Formula A1

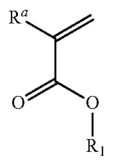

Formula A2

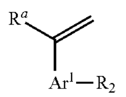

Formula A3

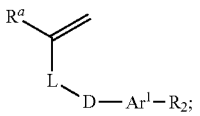

repeating units derived from a monomer of Formula B1, Formula B2, Formula B3, or Formula B4, Formula B1

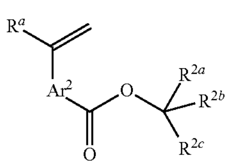

-continued

Formula B2

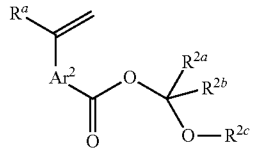

Formula B3

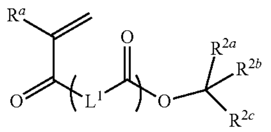

Formula B4

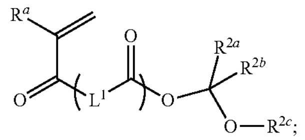

and repeating units derived from a monomer of Formula C1 or Formula C2,

Formula C1

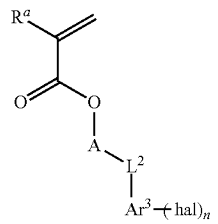

Formula C2

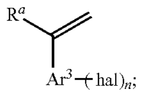

wherein $Ar^1$, $Ar^2$, and $Ar^3$ are each independently an aromatic group;

$R^1$ is a $C_{1-20}$ alkyl alcohol, a $C_{1-20}$ cycloalkyl alcohol, an epoxy with 3 to 12 carbons, or a $C_{5-20}$ aromatic group with one to six ring carbons substituted with a hydroxy, a glycidyl group, a $C_{1-10}$ alkyl alcohol, or an epoxy with 3 to 12 carbons;

$R^2$ is $R^1$ or —OH;

each of $R^{2a}$, $R^{2b}$, and $R^{2c}$ is independently an unsubstituted or substituted $C_{1-20}$ alkyl, an unsubstituted or substituted $C_{3-20}$ cycloalkyl, an unsubstituted or substituted $C_{3-20}$ heterocycloalkyl, or optionally, $R^{2a}$ can join with $R^{2b}$ to form a ring, or $R^{2a}$ can join with $R^{2c}$ of Formulae B2 or B4 to form a ring, or one of $R^{2a}$, $R^{2b}$, and $R^{2c}$ is hydrogen;

L is an unsubstituted or substituted $C_{1-8}$ alkylene group or an unsubstituted or substituted $C_{2-8}$ heteroalkylene group;

$L^1$ is an unsubstituted or substituted $C_{1-8}$ alkylene group, an unsubstituted or substituted $C_{2-8}$ heteroalkylene group, an unsubstituted or substituted $C_{6-10}$ arylene group, or an unsubstituted or substituted $C_{3-10}$ heteroarylene group;

$L^2$ is a single bond, —O—, —O(C═O)—, —(C═O)O—, —$O(SO_2)$—, —$(SO_2)O$—, —$NH(SO_2)$—, —$(SO_2)NH$—, —NH(C═O)—, —(C═O)NH—, —$SO_2$—, or —SO—;

D is a single bond, —O—, —OC(O)—, —NH(C═O)—, or —(C═O)NH—;

A is an unsubstituted or substituted $C_{1-16}$ alkylene group, an unsubstituted or substituted $C_{2-16}$ heteroalkylene group, an unsubstituted or substituted $C_{6-20}$ arylene group, an unsubstituted or substituted $C_{3-20}$ heteroarylene group;

each hal is independently a halogen atom or a $C_{1-4}$ haloalkyl;

$R^a$ is a hydrogen atom, a halogen atom, a $C_{1-4}$ alkyl, or a $C_{1-4}$ haloalkyl;

m is 0 or 1, and n is 1 to 12;

a crosslinker;

an acid catalyst; and a solvent.

In one aspect, $Ar^1$, $Ar^2$, and $Ar^3$ are independently monocyclic or polycyclic aromatic groups. When the group is polycyclic, the rings may be fused (such as naphthyl, anthracenyl, pyrenyl, or the like), directly linked (such as biphenyl, or the like), bridged by a heteroatom (such as triphenylamino or diphenylene ether). In an embodiment, the polycyclic aromatic group may include a combination of fused and directly linked rings (such as a linking of two naphthylene or the like).

In one aspect, $Ar^1$, $Ar^2$, and $Ar^3$ are independently an aromatic group with three to twenty ring carbons, or five to sixteen ring carbons, and optionally, include one to four ring heteroatoms chosen from N, O, or S.

It is further understood that any one or more ring carbons of $Ar^1$, $Ar^2$, and $Ar^3$ may be independently substituted as defined herein. For example, one to six ring carbons of $Ar^1$, $Ar^2$, and $Ar^3$ may be substituted.

In one aspect, a list of exemplary substituents of the aromatic groups $Ar^1$, $Ar^2$, and $Ar^3$ may independently include, but is not limited to, substituted or unsubstituted $C_{1-10}$ alkyl, substituted or unsubstituted $C_{1-10}$ alkoxy, substituted or unsubstituted $C_{1-10}$ haloalkyl, substituted or unsubstituted $C_{4-6}$ cycloalkyl, substituted or unsubstituted $C_{3-5}$ heterocycloalkyl, substituted or unsubstituted $C_{2-10}$ alkenyl, substituted or unsubstituted $C_{2-10}$ alkynyl, substituted or unsubstituted $C_{6-14}$ aryl, substituted or unsubstituted $C_{6-18}$ aryloxy, substituted or unsubstituted $C_{7-14}$ arylalkyl, substituted or unsubstituted $C_{7-14}$ alkylaryl, substituted or unsubstituted $C_{3-14}$ heteroaryl, halogen, —CN, —$NO_2$, —$CO_2R^4$, where $R^4$ is H, —OH, or $C_{1-6}$ alkyl.

In one aspect, $Ar^1$ of Formula A2 or Formula A3, $Ar^2$ of Formula B1 or Formula B2, and $Ar^3$ of Formula C1 or Formula C2, are each independently aromatic groups represented by Formula G or Formula H below, where a group of Formula G is directly bonded to a same or different group of Formula G, a group of Formula H is directly bonded to a same or different group of Formula H, or a group of Formula G is directly bonded to or a group of Formula H, Formula G

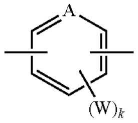

Formula H

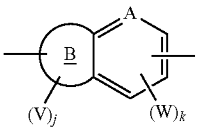

wherein, in Formula G and Formula H:

A is $CR^C$ or N, wherein $R^C$ is hydrogen, substituted or unsubstituted $C_{1-10}$ alkyl, substituted or unsubstituted $C_{1-10}$ alkoxy, or substituted or unsubstituted $C_{6-12}$ aryl, or substituted or unsubstituted $C_{6-12}$ heteroaryl;

ring B represents a fused aromatic group with one to four aromatic rings;

each V and each W represents a ring carbon that is optionally substituted as defined herein, where j is an integer from 0 to 6, and k is an integer from 0 to 2. Exemplary substituents for V and W include, but not limited to, —OH, —SH, —C(O)OH, —$NH_2$, —$R^A$, —$OR^A$, —C(O)$OR^A$, —$SR^A$, or —$NHR^A$, and $R^A$ is as defined above.

In one aspect, $Ar^1$ and $Ar^3$ are independently phenyl, naphthyl, anthracenyl, pyrenyl, pyridinyl quinolinyl, biphenylene, triphenylene, fluorenyl, or carbazoyl; and $Ar^2$ is phenylene, naphthylene, anthracenylene, pyrenylene, pyridinylene, quinolinylene, biphenylene, fluorenylene, or carbazoylene, each of which is optionally further substituted at a ring carbon.

In one aspect, $Ar^1$ and $Ar^3$ are each independently a phenyl, naphthyl, biphenyl, or fluorenyl, each of which is optionally further substituted at a ring carbon; and $Ar^2$ is a phenylene, naphthylene, biphenylene, or fluorenylene, each of which is optionally further substituted at a ring carbon; and hal is F, Br, I, or if n is 2 or more a combination thereof.

In one aspect, $R^1$ of Formulae A1, A2, or A3 is a $C_{1-10}$ alkyl alcohol, an epoxy with 3 to 8 carbons, or a $C_{5-10}$ aromatic group with one to four ring carbons substituted with a hydroxy, an epoxy with 3 to 8 carbons, e.g., a glycidyl group;

each of $R^{2a}$, $R^{2b}$, and $R^{2c}$ of Formulae B1, B2, B3, and B4 is independently an unsubstituted or substituted $C_{1-8}$ alkyl, and optionally, $R^{2a}$ joins with $R^{2b}$ to form a ring, or $R^{2a}$ joins with $R^{2c}$ of Formulae B1 or B4 to form a ring;

$L^1$ of Formulae B1, B2, B3, and B4 is independently an unsubstituted or substituted $C_{1-8}$ alkylene group or an unsubstituted or substituted $C_{2-8}$ heteroalkylene group;

$L^2$ of Formula C1 is a single bond, —O—, —O(C═O)—, or —NH(C═O)—, and

A is an unsubstituted or substituted $C_{2-8}$ alkylene group, an unsubstituted or substituted $C_{3-8}$ heteroalkylene group.

In one aspect, the composition includes a polymer in which: the repeating units derived from a monomer of Formulae A1, A2, and A3 account for 10 mol percent (mol %) to 80 mol %, or 20 mol % to 60 mol %; the repeating units derived from a monomer of Formulae B1, B2, B3, and/or B4 account for 15 mol % to 80 mol %, or 25 mol % to 60 mol %; and the repeating units derived from a monomer of Formula C1 and/or Formula C2 account for 5 mole percent (mol %) to 80 mol %, or 10 mol % to 70 mol %, based on the total moles of repeating units of the polymer.

In one aspect, the repeating units derived from a monomer of Formulae A1, A2, and A3 are represented by one or more of the following

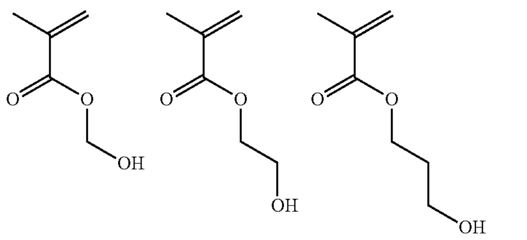
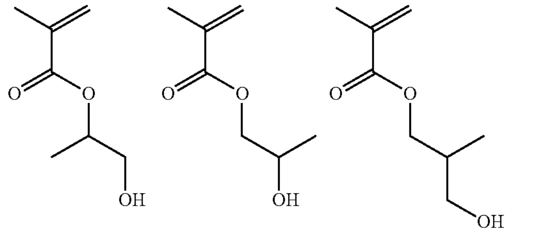
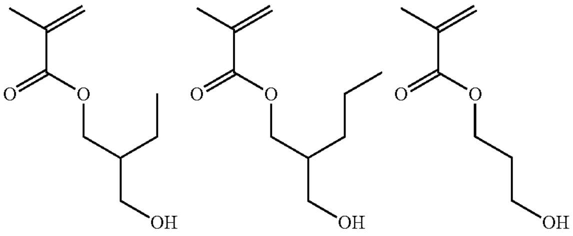
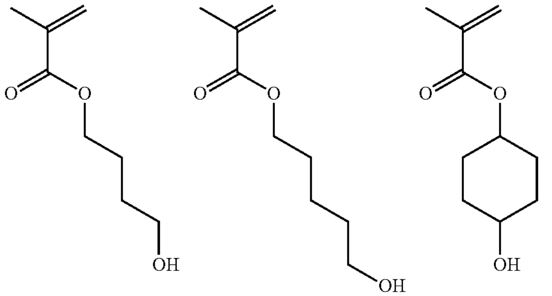
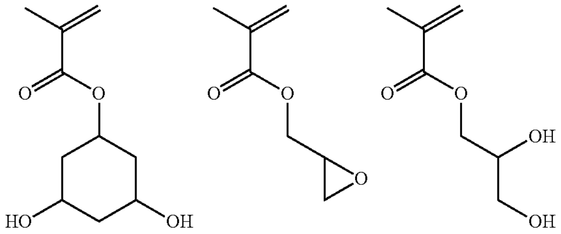
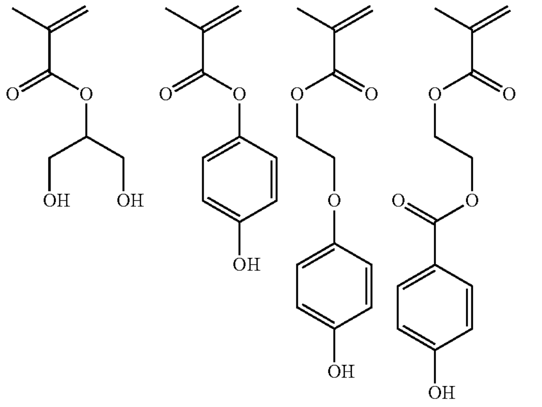
-continued
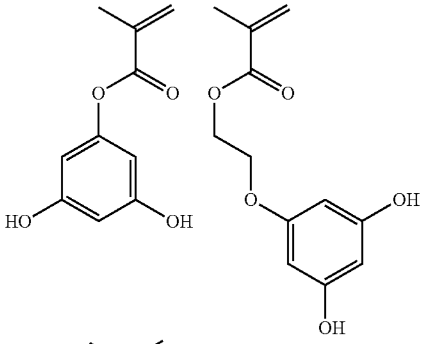
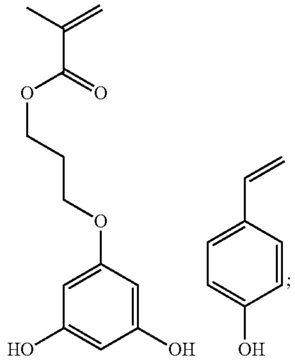
and
the repeating units derived from monomer of Formulae B1 and B3 are represented by one or more of the following
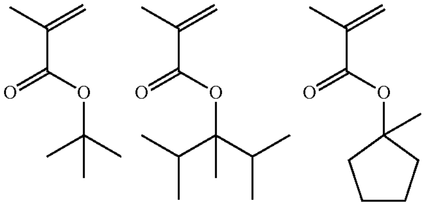
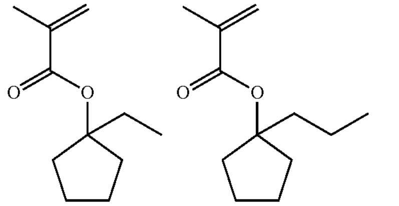
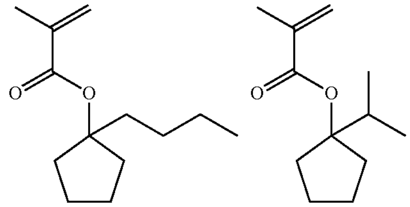
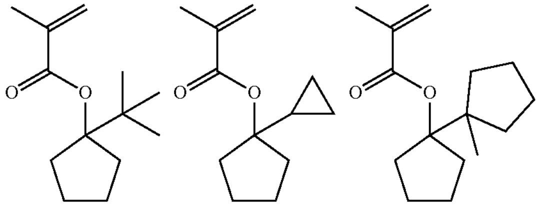

-continued

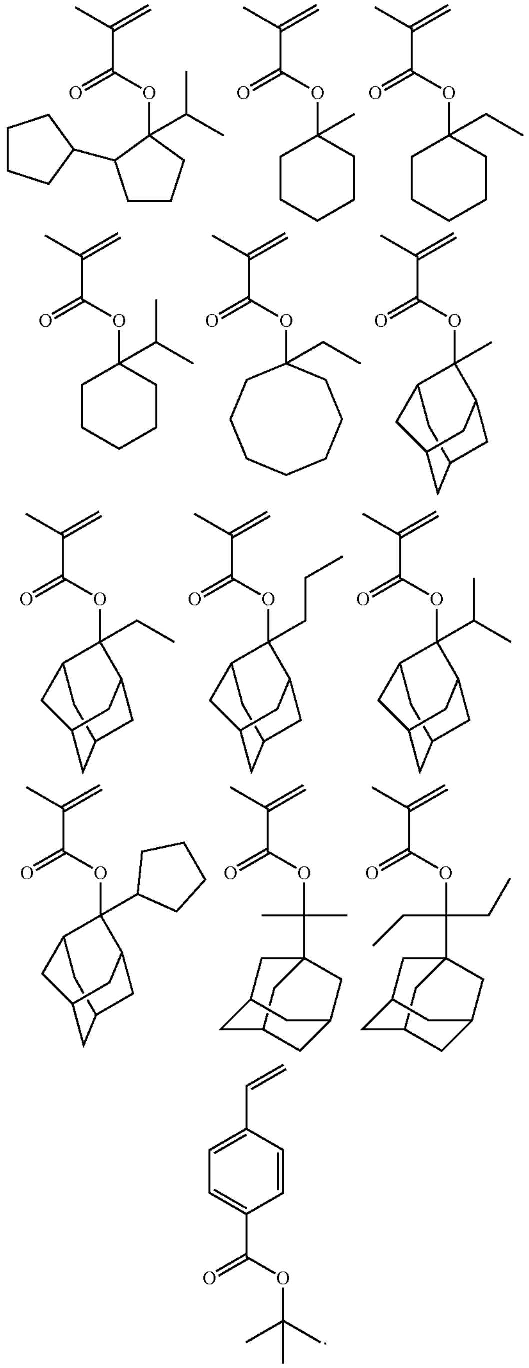

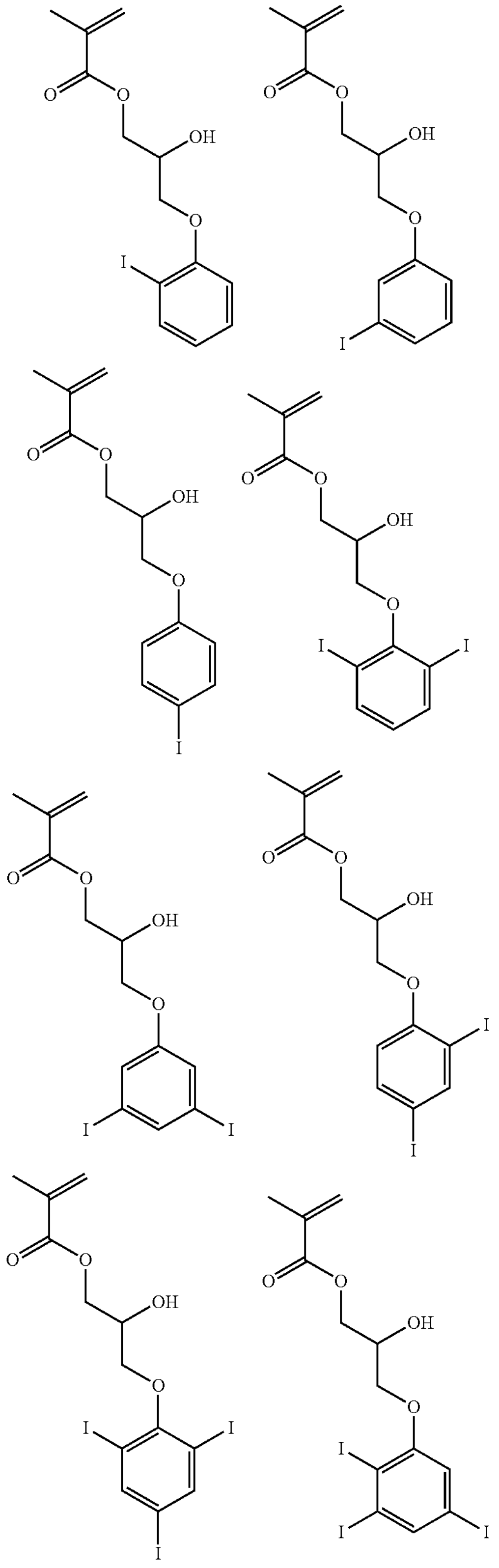

In one aspect, a person of ordinary skill would recognize and understand that any one or more of the hydroxy groups of Formula A1, A2, and A3, as shown in the above monomer structures can be substituted with an epoxy group with 3 to 10 carbon atoms, e.g., a glycidyl group.

In one aspect, the repeating units derived from a monomer of Formulae C1 and C2 are represented by one or more of the following -continued
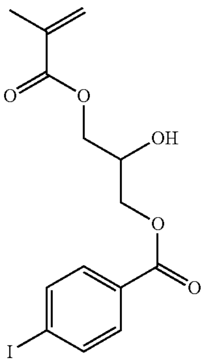
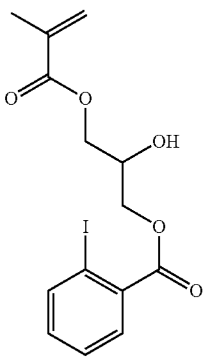
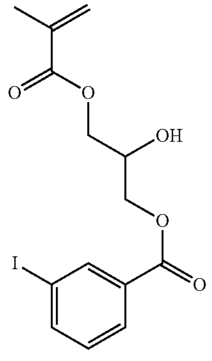
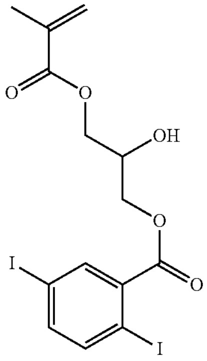
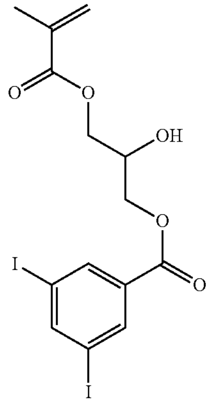
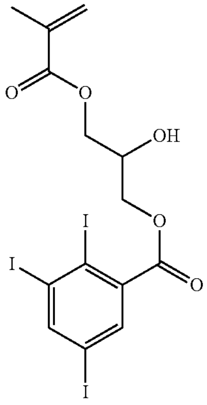
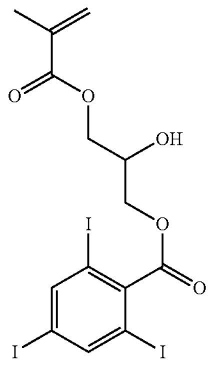
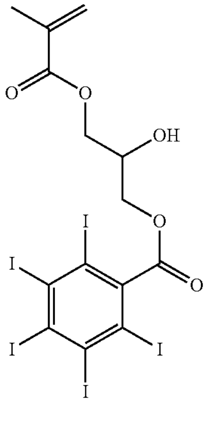
-continued
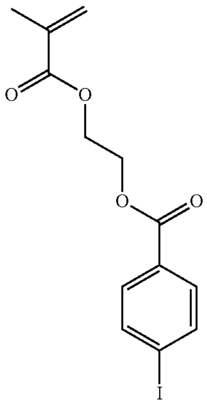
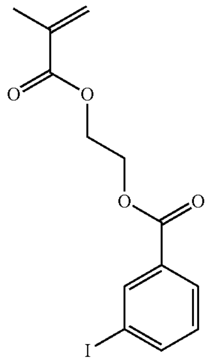
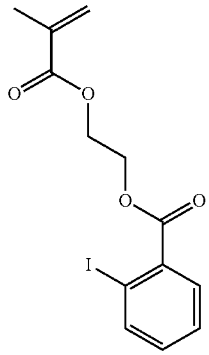
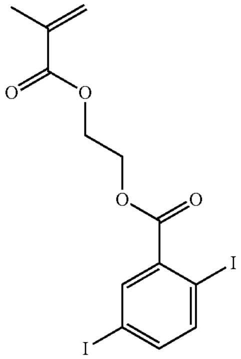
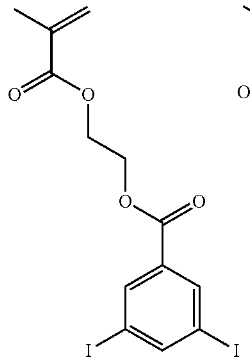
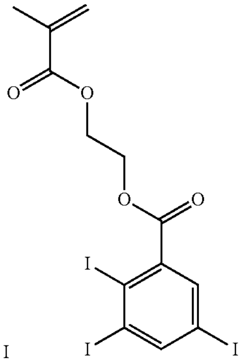
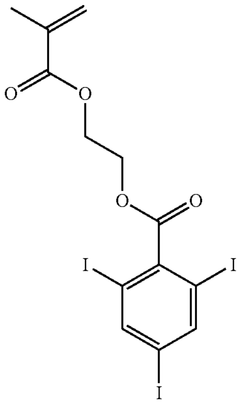
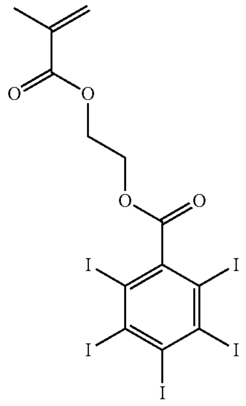

-continued
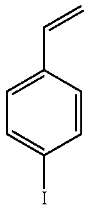
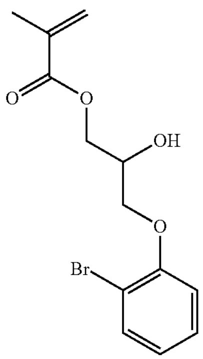
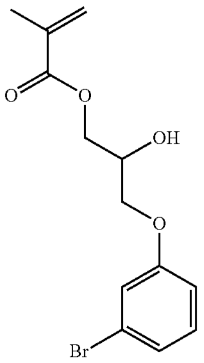
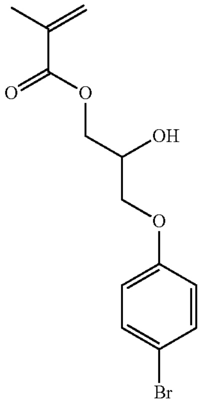
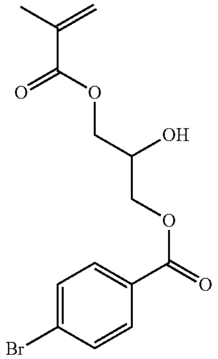
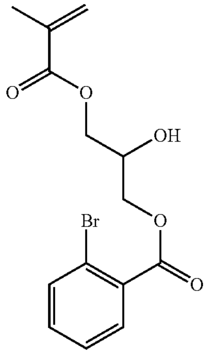
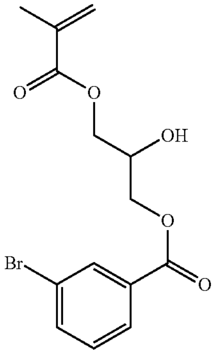
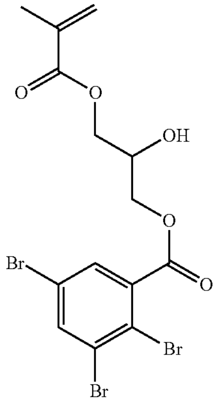
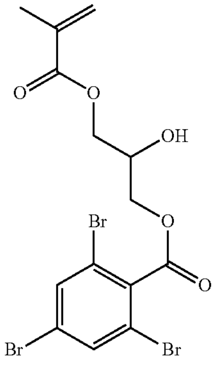
-continued
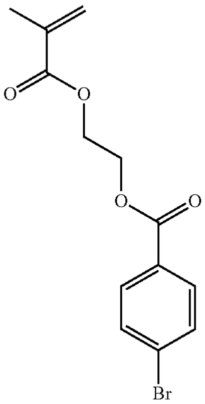
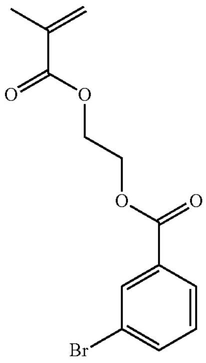
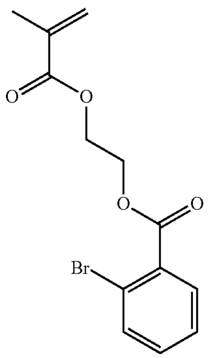
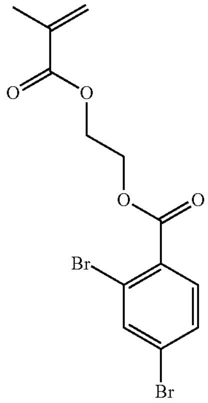
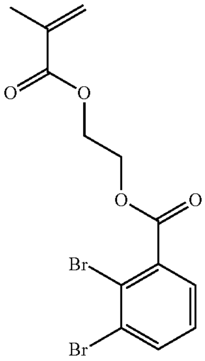
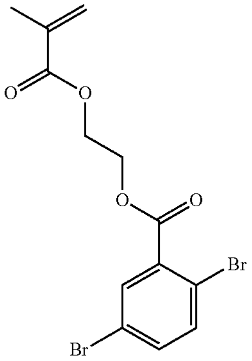
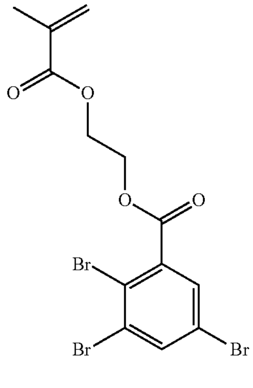
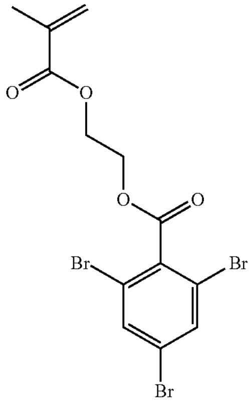

-continued
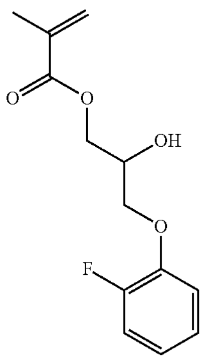
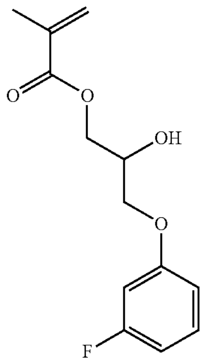
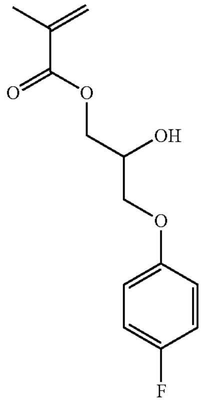
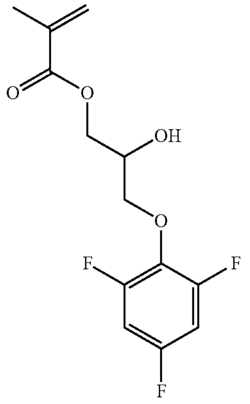
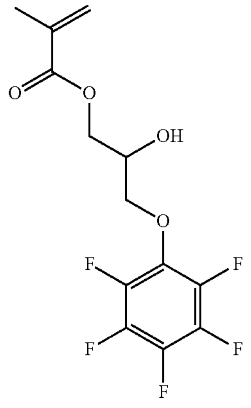
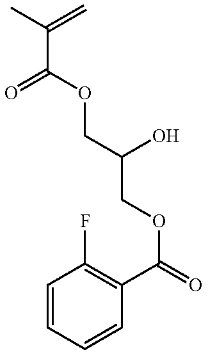
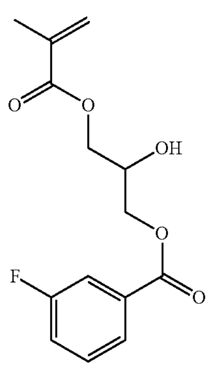
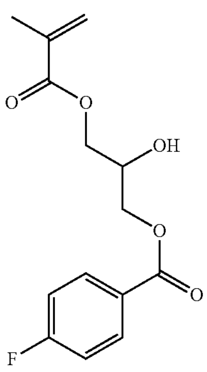
-continued
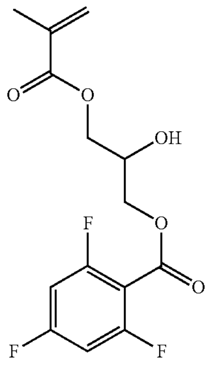
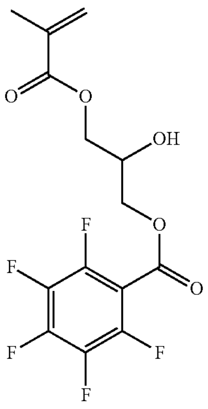
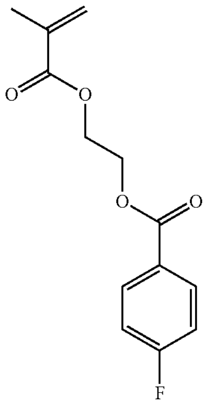
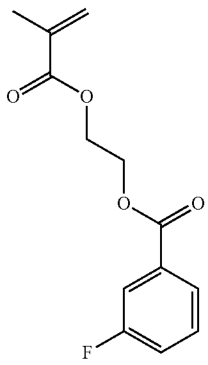
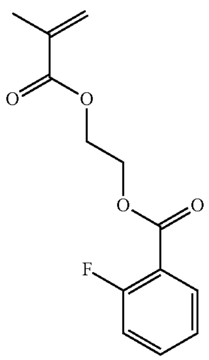
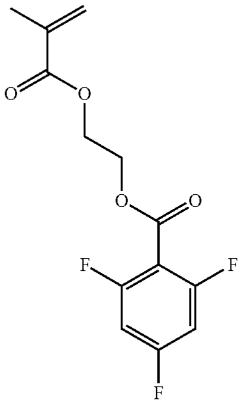
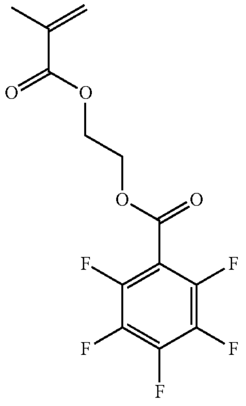
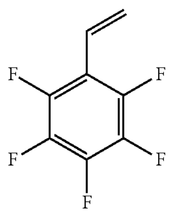

-continued
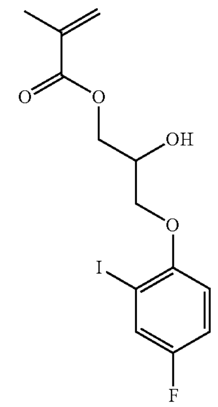
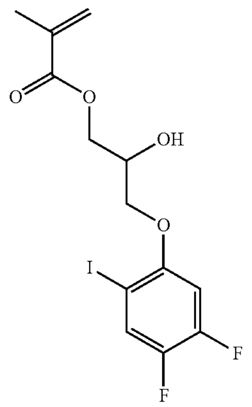
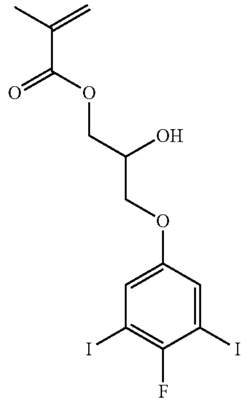
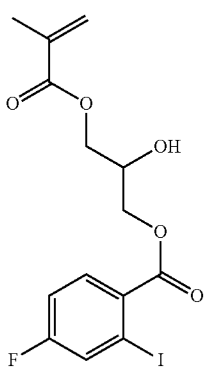
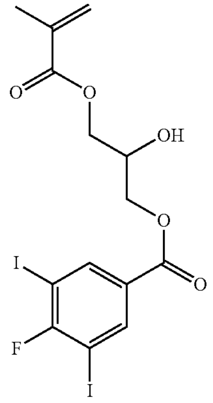
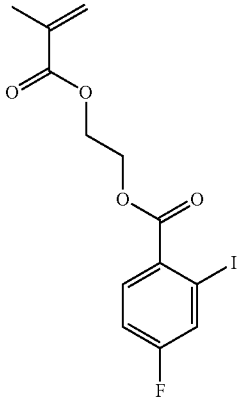
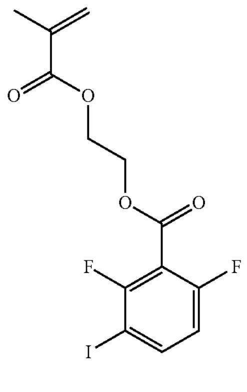
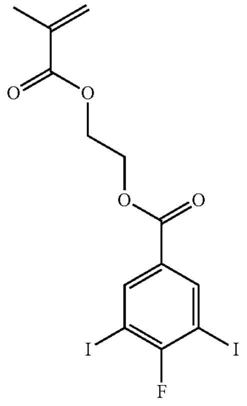
-continued
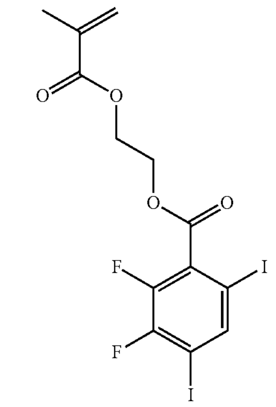
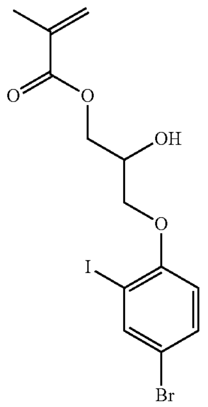
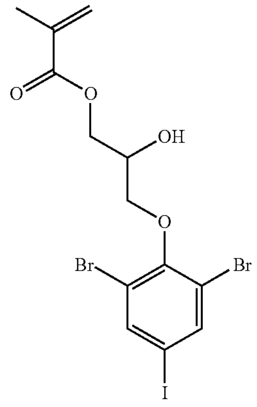
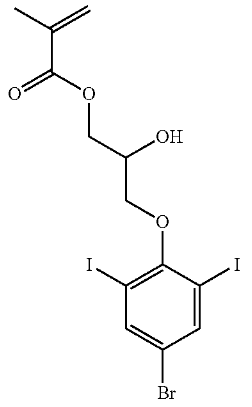
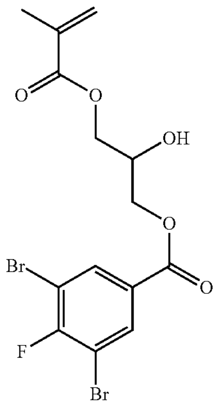
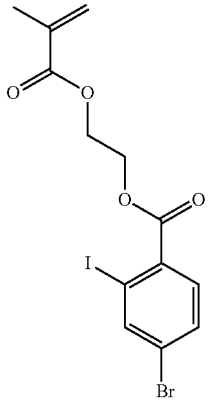
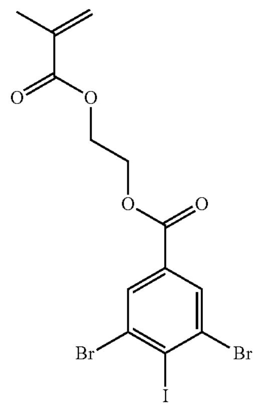
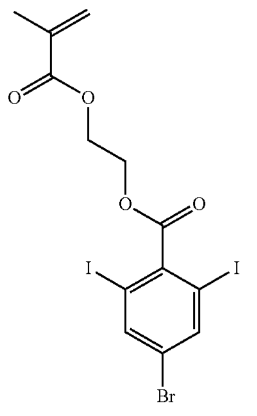

-continued

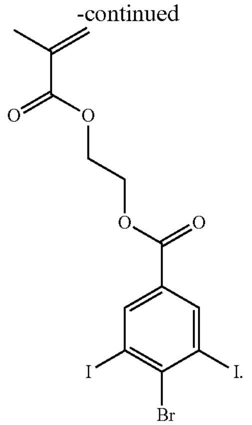

The polymer including repeating units derived from: a monomer of Formula A1, Formula A2, or Formula A3; a monomer of Formula B1, Formula B2, Formula B3, or Formula B4; and a monomer of Formula C1 or Formula C2, may have a weight average molecular weight ($M_w$) of 1,000 to 300,000 grams per mole (g/mol), preferably 2,000 to 150,000 g/mol, more preferably 4,000 to 100,000 g/mol, even more preferably 4,000 to 60,000 g/mol. Molecular weight may be determined by gel permeation chromatography (GPC). A select molecular weight polymer may allow for lower swelling/higher stripping resistance to solvents with which the coating compositions come into contact in use, for example, solvents used in gap filling, underlayer coating, bottom antireflective coating (BARC), photoresist, and developer materials.

The above described polymer of the composition has little or no crosslinking which allows the composition to be more easily applied to a substrate prior to the crosslinking at a site of one or more repeating units derived from the monomer of Formula A1, Formula A2, or Formula A3.

The polymer of the composition may be prepared using any method in the art. For example, the polymer that is derived from: monomer of: Formulae A1, A2, and/or A3; monomer of Formula B1, B2, B3, and/or B4; and monomer of Formula C1 and/or C2 (at times, hereinafter, referred to the “Polymer” may include one or more additional repeating units derived from monomers well known to those in the photoresist art. Exemplary monomer include, but are not limited to, polyacrylates, polyvinylethers, polyesters, polynorbornenes, polyacetals, polyethylene glycols, polyamides, polyacrylamides, polyphenols, novolacs, styrenic polymers, polyvinyl alcohols, copolymers thereof, or a combination thereof, not to be limited, by the exemplary list above.

In an aspect, the polymer including the repeating units derived from monomers represented by Formulae A1, A2, and/or A3, Formula B1, B2, B3, and/or B4, and Formula C1 and/or C2, at times, hereinafter, “Polymer” can include one or more additional repeating units derived from monomer compounds known in the art, and therefore, provide a copolymer of three or more, e.g., three to six or more, different repeating units, including the repeating units listed above.

As noted, the composition, i.e., a photoresist underlayer composition, includes the Polymer. The Polymer may be the only polymer in the photoresist underlayer composition that is then combined with a crosslink agent and a solvent. In another aspect, the polymer (i.e., with or without additional repeating units) is present in the photoresist underlayer composition in an amount from 15 to 95 wt %, based on the total solids of the composition. For example, the Polymer is present in the photoresist underlayer composition in an amount from 20 to 80 wt %, 30 to 80 wt %, 40 to 80 wt %, or 50 to 75 wt %, based on the total solid content of the composition.

The photoresist underlayer composition may include one or more optional additives including, for example, surfactants, antioxidant, or the like, or a combination thereof. When present, each optional additive may be used in the photoresist underlayer composition in minor amounts such as from 0.01 to 10 wt %, based on total solids (solid content) of the photoresist underlayer composition.

The desired total solid content of the photoresist underlayer composition will depend on factors such as the desired final layer thickness. Typically, the total solids of the photoresist underlayer composition may be from 0.1 to 20 wt %, for example, from 0.1 to 10 wt %, more typically, from 0.11 to 5 wt %, based on the total weight of the coating composition.

The photoresist underlayer composition may be prepared following known procedures. The photoresist underlayer composition may be used as is or may be subjected to purification or dilution prior to being coated on the substrate. Purification may involve, for example, one or more of centrifugation, filtration, distillation, decantation, evaporation, treatment with ion exchange beads, and the like.

The composition may further include additives such as a solvent, a crosslinker, a polymerization initiator, an acid catalyst, and the like. A crosslinking agent will have at least 2, and preferably at least 3, moieties capable of reacting with the polymer of the composition under suitable conditions such as under acidic conditions. Exemplary crosslinking agents include, but are not limited to, novolac resins, epoxy-containing compounds, melamine compounds, guanamine compounds, isocyanate-containing compounds, benzocyclobutenes, and the like, and preferably any of the foregoing having 2 or more, preferably 3 or more, and more preferably, substituents selected from methylol, $C_{1-10}$ alkoxymethyl, and $C_{2-10}$ acyloxymethyl. The amount of such cross-linking agents useful in the present compositions is well-known to those skilled in the art and is typically from 0.5 to 30 wt %, e.g., 0.5 to 15 wt % or 0.5 to 8 wt %, relative to total solids.

In an aspect, the crosslink agent may be represented by Formula D or Formula E:

Formula D

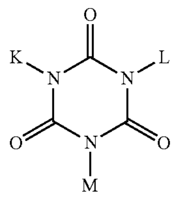

Formula E

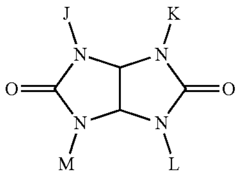

In Formulae D and E, J, K, L, and M are each independently a linear or branched substituted or unsubstituted $C_{1-10}$ hydrocarbon group or a substituted or unsubstituted $C_{2-10}$ heteroalkyl group, e.g., $—(CH_2)_rO(alkyl)$, $—(CH_2)_rOC(O)(alkyl)$, or $—(CH_2)_rC(O)O\text{-}alkyl$, where r is 1 to 6.

In Formulae D and E, for J, K, L, and M, each of the $C_{1-10}$ hydrocarbon group or $C_{1-10}$ heteroalkyl group is optionally substituted with at least one of a halogen, an amino group, a thiol group, an epoxy group, an amido group, a $C_{1-5}$ alkyl group, a $C_{3-8}$ cycloalkyl group, a $C_{3-20}$ heterocycloalkyl group, a $C_{2-5}$ alkenyl group, a $C_{1-5}$ alkoxy group, a $C_{2-5}$ alkenoxy group, a $C_{6-10}$ aryl group, a $C_{6-10}$ aryloxy group, a $C_{7-10}$ alkylaryl group, or $C_{7-10}$ alkylaryloxy group.

In an aspect, the crosslink agent may be represented by one of the following compounds

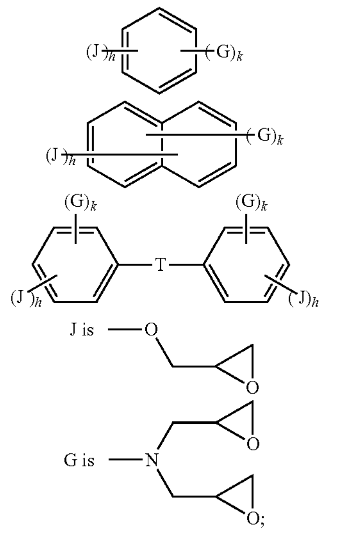

wherein k is 1, 2, 3, or 4, and each h is 0, 1, or 2; and T is absent, O, S, —C(O)—, a substituted or unsubstituted $C_{1-4}$ alkylene, or $—NR^2—$, wherein $R^2$ is H, a substituted or unsubstituted $C_{1-4}$ alkyl, or a substituted or unsubstituted $C_{6-10}$ aryl.

Other crosslink agents that undergo acid-catalyzed crosslinking with the polymer may include, for example: trivinylbenzene, divinyltoluene; divinylpyridine, divinylnaphthalene and divinylxylene; and such as ethyleneglycol diacrylate, trimethylol propane triacrylate, diethyleneglycol divinyl ether, trivinylcyclohexane, allyl methacrylate ("ALMA"), ethyleneglycol dimethacrylate ("EGDMA"), diethyleneglycol dimethacrylate ("DEGDMA"), propyleneglycol dimethacrylate, propyleneglycol diacrylate, trimethylolpropane trimethacrylate ("TMPTMA"), divinyl benzene ("DVB"), glycidyl methacrylate, 2,2-dimethylpropane 1,3 diacrylate, 1,3-butylene glycol diacrylate, 1,3-butylene glycol dimethacrylate, 1,4-butanediol diacrylate, diethylene glycol diacrylate, diethylene glycol dimethacrylate, 1,6-hexanediol diacrylate, 1,6-hexanediol dimethacrylate, tripropylene glycol diacrylate, triethylene glycol dimethacrylate, tetraethylene glycol diacrylate, polyethylene glycol diacrylate, tetraethylene glycol dimethacrylate, polyethylene glycol dimethacrylate, ethoxylated bisphenol A diacrylate, ethoxylated bisphenol A dimethacrylate, polyethylene glycol dimethacrylate, poly(butanediol)diacrylate, pentaerythritol triacrylate, trimethylolpropane triethoxy triacrylate, glyceryl propoxy triacrylate, pentaerythritol tetraacrylate, pentaerythritol tetramethacrylate, dipentaerythritol monohydroxypentaacrylate, tetra($C_1$-$C_8$)alkoxyglycoluril such as tetramethoxyglycoluril and tetrabutoxyglycoluril, and combinations thereof.

Acid catalysts include free acids and acid generators. Any free acid which is compatible with the compositions described and catalyzes crosslinking of the crosslinkable polymer and the crosslinker is suitable for use in the present invention. Examples of free acids include, but are not limited to, sulfonic acids such as methane sulfonic acid, ethane sulfonic acid, propyl sulfonic acid, phenyl sulfonic acid, toluene sulfonic acid, dodecylbenzene sulfonic acid, and trifluoromethyl sulfonic acid. The coating composition may include a single acid catalyst or may include two or more different acid catalysts.

The acid catalyst may be a thermal acid generator (TAG), which is a compound that is capable of generating an acidic moiety when heated. The thermal acid generator can be nonionic or ionic. Suitable nonionic thermal acid generators include, for example, cyclohexyl p-toluenesulfonate, methyl p-toluenesulfonate, cyclohexyl 2,4,6-triisopropylbenzene sulfonate, nitrobenzyl esters, benzoin tosylate, 2-nitrobenzyl tosylate, tris(2,3-dibromopropyl)-1,3,5-triazine-2,4,6-trione, alkyl esters of organic sulfonic acids, p-toluenesulfonic acid, dodecylbenzenesulfonic acid, oxalic acid, phthalic acid, phosphoric acid, camphorsulfonic acid, 2,4,6-trimethylbenzene sulfonic acid, triisopropylnaphthalene sulfonic acid, 5-nitro-o-toluene sulfonic acid, 5-sulfosalicylic acid, 2,5-dimethylbenzene sulfonic acid, 2-nitrobenzene sulfonic acid, 3-chlorobenzene sulfonic acid, 3-bromobenzene sulfonic acid, 2-fluorocaprylnaphthalene sulfonic acid, dodecylbenzene sulfonic acid, 1-naphthol-5-sulfonic acid, 2-methoxy-4-hydroxy-5-benzoyl-benzene sulfonic acid, and their salts, and combinations thereof. Suitable ionic thermal acid generators include, for example, dodecylbenzenesulfonic acid triethylamine salts, dodecylbenzenedisulfonic acid triethylamine salts, p-toluene sulfonic acid-ammonium salts, sulfonate salts, such as carbocyclic aryl (e.g. phenyl, napthyl, anthracenyl, etc.) and heteroaryl (e.g. thienyl) sulfonate salts, aliphatic sulfonate salts and benzenesulfonate salts. Compounds that generate a sulfonic acid upon activation are generally suitable. Preferred thermal acid generators include p-toluenesulfonic acid ammonium salts and fluorinated derivatives thereof. In an embodiment, the acid catalyst comprises N-benzyl-N,N-dimethylammonium trifluoromethanesulfonate.

The acid catalyst may be a photoacid generator (PAG), which is a compound that could generate an acidic moiety when exposed to activating radiation. Suitable photoacid generators include, for example, sulfide and onium type compounds. Photoacid generators include, but are not limited to diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate, (4-tbutylphenyl)tetramethylenesulfonium (3-hydroxyadamantanyl ester)-tetrafluoro-butanesulfonate), (4-tbutylphenyl)tetramethylenesulfonium (adamantanyl ester)-tetrafluoro-butanesulfonate) and dibutylnaphthylsulfonium triflate. Preferred PAGs include tetramethylenesulfonium compounds.

The composition may further include any suitable solvent or mixtures of solvents. Suitable solvents include, for example, one or more oxyisobutyric acid esters, particularly methyl-2-hydroxyisobutyrate, 2-hydroxyisobutyric acid, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol, and ethoxy propanol; methyl 2-hydroxyisobutyrate; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone.

In one aspect, the composition includes a mixture of two or more different solvents, e.g., three or more different solvents. For example, a solvent mixture may include, but is not limited to. A mixture of an alkylene glycol monomethyl ether acetate, methyl-2-hydroxyisobutyrate or 2-hydroxyisobutyric acid, and a gamma lactone, e.g., gamma-butyro lactone.

The concentration of the monomer components described herein based on the total weight of monomer components and crosslink agent (solid content) and solvent will depend on several factors such as the functional or commercial application of the composition. In general, the total solids content of the composition may be from 0.1 wt % to 20 wt %, 0.1 wt % to 10 wt %, or from 0.1 wt % to 5 wt %, based on the total weight of the composition.

Application of Composition to Layer Material or Substrate

The composition may be applied as a layer to a substrate or as layer atop another layer or film by any suitable method including spin-coating, dipping, roller-coating or other conventional coating technique. Preferably, the composition is applied by spin coating. For spin-coating, the solids content of the composition may be adjusted to provide a desired film thickness based upon the specific coating equipment utilized, the viscosity of the solution, the speed of the coating tool and the amount of time allowed for spinning. The composition is generally applied on a substrate with a dried layer thickness of 0.01 micrometers (μm) and 0.5 μm, preferably a dried layer thickness of 0.04 μm and 0.20 μm.

A wide variety of substrates may be used with electronic device substrates being typical. Suitable substrates include, for example, packaging substrates such as multichip modules; flat panel display substrates; integrated circuit substrates; substrates for light emitting diodes (LEDs) including organic light emitting diodes (OLEDs); semiconductor wafers; polycrystalline silicon substrates; and the like. Suitable substrates may be in the form of wafers such as those used in the manufacture of integrated circuits, optical sensors, flat panel displays, integrated optical circuits, and LEDs.

As used herein, the term "semiconductor wafer" is intended to encompass "an electronic device substrate," "a semiconductor substrate," "a semiconductor device," and various packages for various levels of interconnection, including a single-chip wafer, multiple-chip wafer, packages for various levels, or other assemblies requiring solder connections.

Substrates may be any dimension and shape, and are preferably those useful for photolithography, such as silicon, silicon dioxide, silicon-on-insulator (SOI), strained silicon, gallium arsenide, and coated substrates. The substrate may include one or more layers. The layers contained in the substrate may be one or more conductive layers of aluminum, copper, molybdenum, manganese, iron, nickel, copper, zinc, palladium, silver, cadmium, tantalum, titanium, tungsten, platinum, mercury, or alloys thereof; nitrides or silicides; doped amorphous silicon or doped polysilicon; a dielectric layer such as a layer of silicon oxide, silicon nitride, a silicon oxynitride, or a metal oxide; a semiconductor layer such as single-crystal silicon; a glass layer; a quartz layer; or combinations or mixtures thereof, but are not limited thereto. Preferably, the uppermost layer of the substrate, or the outermost layer of the substrate, includes (for example, is coated with) a soft metal such as manganese, iron, nickel, copper, zinc, palladium, silver, cadmium, tantalum, tungsten, platinum, mercury, or alloys thereof. Each layer may be formed by various techniques, for example, chemical vapor deposition (CVD) such as plasma-enhanced CVD, low-pressure CVD or epitaxial growth, physical vapor deposition (PVD) such as sputtering or evaporation, electroplating, or a liquid coating technique such as spin-coating.

After being applied on the substrate or underlayer, the composition is optionally softbaked at a relatively low temperature to remove any solvent and other relatively volatile components from the composition layer. Typically, the substrate or layered substrate is baked at a temperature of less than or equal to 150° C., preferably from 60 to 125° C., and more preferably from 90 to 115° C. The baking time is typically from 10 seconds to 10 minutes, preferably from 30 seconds to 5 minutes, and more preferably from 6 to 90 seconds.

The applied composition may be optionally thermally treated prior to overcoating with another composition or layer. Such thermal treatment may cause hardening including additional crosslinking of the composition. For example, the applied composition layer may be cured after being disposed on the substrate. Cure conditions will vary with the components of the composition. Cure conditions may render the composition cured layer substantially insoluble to the solvent used to apply subsequent layer(s) as well as an alkaline aqueous developer solution. For example, the composition layer may be sufficiently cured such that the layer does not intermix with a subsequently applied layer, such as a photoresist or other organic layer disposed directly on the photoresist underlayer formed with the composition. The composition layer may be cured in an oxygen-containing atmosphere, such as air, or in an inert atmosphere, such as nitrogen and under conditions, such as heating, sufficient to provide a cured coating layer. Exemplary curing is by heating the composition layer at a curing temperature of 150° C. or greater, and preferably 150 to 450° C. It is more preferred that the curing temperature is 180° C. or greater, still more preferably 200° C. or greater, and even more preferably from 200 to 300° C. When a thermal acid generator is used, the curing temperature should be sufficient for the thermal acid generator to liberate acid to aid in curing of the composition. The curing time may be from 10 seconds to 10 minutes, preferably from 30 seconds to 5 minutes, more preferably from 45 seconds to 5 minutes, and stilly more preferably from 45 to 90 seconds. The curing temperature may be selected based on the desired curing rate to achieve a cured composition layer.

The initial baking step may not be necessary if the curing step is conducted in such a way that rapid evolution of the solvents and curing by-products do not disrupt the film quality. For example, a ramped bake beginning at relatively low temperatures and then gradually increasing to the range of 200 to 325° C. may give acceptable results. It may be preferable in some cases to have a two-stage curing process, with the first stage being a lower bake temperature of less than 200° C., and the second stage being a higher bake temperature preferably between 200 and 400° C.

After curing of the composition layer, one or more processing layers, such as a photoresist layer, e.g., a photoresist layer including one or more metals (a metallized photoresist layer) a silicon-containing layer, a hardmask layer, a BARC layer, and the like, may be disposed on the cured photoresist underlayer. For example, a photoresist may be disposed, such as by spin coating, directly on the surface of the cured photoresist underlayer. In such a process, a layer of the composition is disposed on a substrate (or underlayer) and cured as described above to form a coating layer (i.e., the cured photoresist underlayer). Next, one or more additional layers are disposed on the coating layer. For example, a silicon-containing layer or a hardmask layer is disposed directly on the coating layer. Exemplary silicon-containing layers include a silicon-BARC, which may be spin coated on the underlayer followed by curing, or an inorganic silicon layer such as SiON or $SiO_2$, which may be deposited on the coating composition layer by chemical vapor deposition (CVD). Any suitable hardmask may be used and may be deposited on the coating layer by any suitable technique and cured as appropriate. Optionally, an organic BARC layer may be disposed directly on the silicon-containing layer or hardmask layer, and appropriately cured.

In an aspect, a photoresist is disposed directly on the cured photoresist underlayer, directly on the silicon-containing layer (in a trilayer process), or directly on the organic BARC layer (in a quadlayer process). The photoresist layer is then imaged (exposed) using patterned actinic radiation, and the exposed photoresist layer is then developed using the appropriate developer to provide a patterned photoresist layer. The pattern is next transferred from the photoresist layer to the layer directly below it, by appropriate etching techniques known in the art, such as by plasma etching, resulting in a patterned silicon-containing layer in a trilayer process and a patterned organic BARC layer in a quadlayer process. If a quadlayer process is used, the pattern is next transferred from the organic BARC layer to the silicon-containing layer or hardmask layer using appropriate pattern transfer techniques, such as plasma etching. After the silicon-containing layer or hardmask layer is patterned, the coating layer is then patterned using appropriate etching techniques, such as $O_2$ plasma. Any remaining patterned photoresist and organic BARC layers are removed during etching of the coating layer. Next, the pattern is then transferred to the substrate, such as by appropriate etching techniques, which also removes any remaining silicon-containing layer or hardmask layer, followed by removal of any remaining patterned coating layer to provide a patterned substrate.

The patterning methods of the present invention comprise applying a layer of the photoresist underlayer composition over a substrate (optionally, also including one or more layers positioned between the substrate and the applied underlayer composition): curing the applied photoresist underlayer composition to form a coated underlayer: and forming a photoresist layer over the coated underlayer. The method may further include the steps of pattern-wise exposing the photoresist layer to activating radiation: and developing the exposed photoresist layer to provide a resist relief image. In some aspects, the method may further include forming a silicon-containing layer, an organic antireflective coating layer, or a combination thereof, over the coated underlayer prior to forming the photoresist layer. In some aspects, the method may further include transferring the pattern to the silicon-containing layer, the organic antireflective coating layer, or the combination thereof, after developing an exposed photoresist layer and before the step transferring the pattern to the coated underlayer.

It may be desired in certain patterning methods of the invention to provide one or more lithographic layers such as a hardmask layer, for example, a spin-on-carbon (SOC), amorphous carbon, or metal hardmask layer, a CVD layer such as a silicon nitride (SiN) layer, silicon oxide (SiO) layer, or silicon oxynitride (SiON) layer, an organic or inorganic BARC layer, or a combination thereof, on an upper surface of the substrate prior to forming the photoresist underlayer of the invention. Such layers, together with a layer of the photoresist underlayer composition of the invention and photoresist layer, form a lithographic material stack. Typical lithographic stacks which may be used in the patterning methods of the invention include, for example, the following: SOC layer/underlayer/photoresist layer; SOC layer/SiON layer/underlayer/photoresist layer; SOC layer/SiARC layer/underlayer/photoresist layer; SOC layer/metal hardmask layer/underlayer/photoresist layer; amorphous carbon layer/underlayer/photoresist layer; and amorphous carbon layer/SiON layer/underlayer/photoresist layer.

It is to be understood that the "photoresist underlayer," as used herein, refers to the one or more layers that are disposed between the substrate and the photoresist layer (i.e., "above the substrate"). Accordingly, the inventive coated underlayer (i.e., a layer of the photoresist underlayer composition) may be used alone as a photoresist underlayer, or the inventive coated underlayer (i.e., a layer of the photoresist underlayer composition) may be used in conjunction with other underlayers, including those as described herein.

Accordingly, we provide a coated substrate, comprising: a substrate: a photoresist underlayer formed from the composition including the Polymer disposed on the substrate; and a photoresist layer, e.g., a metal-containing photoresist layer, disposed on the photoresist underlayer.

As noted above, other intervening layers may be applied between the photoresist underlayer and the overcoated photoresist layer. In some aspect, the method may further include forming a silicon-containing layer, an organic antireflective coating layer, or a combination thereof, over the coated underlayer prior to forming the photoresist layer.

A wide variety of photoresists may be suitably used in the methods of the invention and are typically positive-tone materials. The particular photoresists to be used will depend on the exposure wavelength used and generally comprise an acid-sensitive matrix polymer, a photoactive component such as a photoacid generator, a solvent, and optional additional components. Suitable photoresists are known to those skilled in the art and are commercially available, for example, various photoresist materials in the UV™ and EPIC™ product families from DuPont Electronics & Industrial. The photoresist can be applied to the substrate by known coating techniques such as described above with reference to the underlayer composition, with spin-coating being typical. A typical thickness for the photoresist layer is from 10 to 300 nm. The photoresist layer is typically next soft baked to minimize the solvent content in the layer, thereby forming a tack-free coating and improving adhesion of the layer to the substrate. The soft bake can be conducted on a hotplate or in an oven, with a hotplate being typical. Typical soft bakes are conducted at a temperature from 70 to 150° C., and a time from 30 to 90 seconds.

In an aspect, the underlayer composition described herein demonstrates commercial or technical advantages in conjunction with photosensitive photoresist layers designed for extreme ultraviolet (EUV) lithography. To produce the smallest possible circuitry, most advanced lithography systems are designed to use light of very short wavelength such as for example, deep-ultraviolet light at a wavelength at or below 200 nm, or extreme ultraviolet (EUV) in the region of about 13.5 nm. Such light sources are relatively weak, so the photoresist layer needs to be designed to utilize this light as efficiently as possible. Essentially photoresists used today for microelectronic/nanoelectronic fabrication employ the concept of chemical amplification to enhance the efficiency of light utilization of a photoresist.

For example, a chemical amplification (CA) photoresist material (layer) can be negative tone material and includes a polymer material that turns insoluble to a developer such as a base solution after the polymer is reacted with acid. In another example, the CA photoresist layer is positive tone and includes a polymer material that turns soluble to a developer after the polymeric material is reacted with acid. In yet another example, the CA photoresist layer includes a polymer material that changes its polarity after the polymer is reacted with acid.

Photoresist layers specifically designed for use in EUV lithography may be a metal-containing photoresist to enhance EUV absorption, resist efficiency and etch selectivity as metals tend to have inherently high EUV photon absorption and slow dry etch rate in comparison to carbon, nitrogen or oxygen. For example, the metal-containing photoresist includes one or more metals such as barium (Ba), indium (In), cerium (Ce), hafnium (Hf) or tin (Sn). The metal-containing photoresist may include a metal organic compound with metal bonded to or incorporated in an organic matrix.

The metal-containing photoresist can provide higher resolution patterning than organic CAR as no acid blurring occurs in patterning process, and with a lower resist thickness. The metal-containing photoresist can provide better collapse performance based on its etch resistance. Moreover, the metal-containing photoresist can function as a sensitizer to increase the sensitivity and efficiency of the resist material to EUV radiation. The metal-containing photoresist may include a metal core (such as a metal ion coordinated to an organic ligand. During a lithographic exposure the metal-containing photoresist absorbs EUV photons and generates radicals, which in turn may cause crosslinking of the photoresist polymer such that the exposed portions of the resist remain during developing. In this case, the resist material is a negative tone resist and does not include an acid-generating compound and/or blocking group since the EUV radiation causes the crosslinking of the metallized photoresist polymer.

The metal-containing photoresist may include an organotin oxo-hydroxide. For example, organo-tin compounds with bonds to alkyl groups, especially branched alkyl groups (including cyclic ligands), can be used as improved radiation patterned precursor film forming compounds. Films formed with the compounds can be patterned with desirable doses of EUV radiation to achieve very high resolution patterns. The organo-ligand of the organo-tin compounds can provide good precursor solution stability and good radiation sensitivity upon forming a coating.

For example, an organotin oxo-hydroxide represented by the formula, $RSnO_{(3/2-x/2)}(OH)_x$, where $0<x<3$, and R is a $C_{1-22}$ alkyl group, $C_{1-22}$ heteroalkyl group, $C_{3-22}$ cycloalkyl group, $C_{2-22}$ heterocycloalkyl group, $C_{6-14}$ aryl group, or $C_{3-14}$ heteroaryl group. In an instance, if R is a $C_{1-22}$ alkyl group, $C_{1-22}$ heteroalkyl group, $C_{3-22}$ cycloalkyl group, or $C_{2-22}$ heterocycloalkyl group, it can be advantageous to form a carbon-tin bond to a secondary or tertiary carbon of the group. Moreover, as indicated the tin is bound to one or more oxo-ligands, i.e., Sn═O and/or a hydroxo-ligand, in addition to the organic ligand. The organo ligand and the oxo/hydroxo ligands provide desirable features to a precursor solution and corresponding coating by providing significant control over the condensation process to a metal oxide with resulting significant processing, patterning, and coating advantages.

The use of branched alkyl ligands, e.g., tert-butyl or isopropyl alkyl, may exhibit improved patterning performance. In some instances, suitable mixtures of alkyl-tin compounds with Sn—C bonds to branched and/or unbranched alkyl groups, in particular with at least one branched alkyl group, can be formulated to further improve nano-lithographic patterning performance.

The photoresist layer is next exposed to activating radiation through a photomask to create a difference in solubility between exposed and unexposed regions. References herein to exposing a photoresist composition to radiation that is activating for the composition indicates that the radiation is capable of forming a latent image in the photoresist composition. The photomask has optically transparent and optically opaque regions corresponding to regions of the resist layer to be exposed and unexposed, respectively, by the activating radiation. The exposure wavelength is typically sub-400 nm, and more typically, sub-300 nm, such as 248 nm (KrF), 193 nm (ArF), or an EUV wavelength (e.g., 13.5 nm). In a preferred aspect, the exposure wavelength is 193 nm or an EUV wavelength. The exposure energy is typically from 10 to 100 millijoules per square centimeter ($mJ/cm^2$), depending, for example, on the exposure tool and the components of the photosensitive composition.

Following exposure of the photoresist layer, a post-exposure bake (PEB) is typically performed. The PEB is typically conducted at a temperature from 70 to 150° C., and a time from 30 to 90 seconds. A latent image defined by the boundary between crosslinked regions and non-crosslinked regions (corresponding to exposed and unexposed regions, respectively) is thereby formed. The photoresist layer is next developed to remove the unexposed regions of the layer, leaving the crosslinked exposed regions forming a patterned photoresist layer.

For the negative tone imaging, the developer can be an organic solvent, such as the solvents used to form the precursor solutions. In general, developer selection can be influenced by solubility parameters with respect to the coating material, both irradiated and non-irradiated, as well as developer volatility, flammability, toxicity, viscosity, and potential chemical interactions with other process material. In particular, suitable developers include, for example, aromatic compounds (e.g., benzene, xylenes, toluene), esters, (e.g., propylene glycol monomethyl ester acetate, ethyl acetate, ethyl lactate, n-butyl acetate, butyrolactone), alcohols (e.g., 4-methyl-2-pentanol, 1-butanol, isopropanol, 1-propanol, methanol), ketones (e.g., methyl ethyl ketone, acetone, cyclohexanone, 2-heptanone, 2-octanone), ethers (e.g., tetrahydrofuran, dioxane, anisole) and the like. The developer may be applied by known techniques, for example, spin-coating or puddle coating.

The pattern of the photoresist layer can be transferred to one or more underlying layers including the coated underlayer and to the substrate by appropriate etching techniques, such as by plasma etching using appropriate gas species for each layer being etched. Depending on the number of layers and materials involved, pattern transfer may include multiple etching steps using different etching gases. The patterned photoresist layer, the coated underlayer, and the other optional layers in the lithographic stack may be removed following pattern transfer to the substrate using conventional techniques. Optionally, one or more of the layers of the stack may be removed following, or consumed during, pattern transfer to an underlying layer and prior to pattern transfer to the substrate. For example, pattern transfer to one or more of a silicon-containing layer, an organic antireflective coating layer, or the like may occur after the exposed photoresist layer is developed and before pattern transfer to the coated underlayer. The substrate is then further processed according to known processes in the art to form an electronic device.

The present inventive concept is further illustrated by the following examples, which are intended to be non-limiting. The compounds and reagents used herein are available commercially except where a procedure is provided below.

EXAMPLES

Polymer 1 (P1)

3.00 g glycidyl methacrylate, 8.95 g 4-bromo-2,6-diiodophenol, and 0.08 g tetrabutyl ammonium bromide were dissolved in 30.56 g dimethyl acetamide in a round-bottom flask equipped with a condenser. The mixture was heated at 80° C. for 18 hours with stirring, and subsequently allowed to cool to room temperature. The product, 3-(4-bromo-2,6-diiodophenoxy)2-hydroxypropyl methacrylate (BDIPHPM), was extracted using a combination of ethyl acetate and water, the solvent was removed by evaporation, and the product was dried under vacuum at 40° C. for 16 hours.

3.34 g 2-hydroxyethyl methacrylate (HEMA), 6.57 g tert-butyl methacrylate (tBMA), 17.48 g BDIPHPM and 2.37 g dimethyl 2,2'-azobis(2-methylpropionate) were dissolved in 100.5 g of anisole in a round-bottom flask at room temperature with stirring to provide a monomer solution. 19.5 g anisole was charged into another round-bottom flask equipped with a condenser. The solvent in the round-bottom flask was heated up to 80° C. with stirring. The monomer solution was fed into the round-bottom flask by dropwise over 3 hours. After monomer feeding was completed, the reaction mixture was stirred for an hour at 80° C. The reaction mixture was cooled down in an ice bath and precipitated to 1500 g mixture of methyl tert-butyl ether/heptane. The solvent mixture was filtered and the polymer was dried under vacuum at 40° C. for 16 hours.

Polymer 2 (P2)

3.00 g glycidyl methacrylate, 7.35 g 4-fluoro-3,5-diiodophenol, and 0.08 g tetrabutyl ammonium bromide were dissolved in 30.56 g dimethyl acetamide in a round-bottom flask equipped with a condenser. The mixture was heated at 80° C. for 18 hours with stirring, and subsequently allowed to cool to room temperature. The product, 3-(4-fluoro-3,5-diiodophenoxy)-2-hydroxypropyl methacrylate (FDIPHPM), was extracted using a combination of ethyl acetate and water, the solvent was removed by evaporation, and the product was dried under vacuum at 40° C. for 16 hours.

3.34 g 2-hydroxyethyl methacrylate (HEMA), 6.57 g tert-butyl methacrylate (tBMA), 15.59 g FDIPHPM and 2.37 g dimethyl 2,2'-azobis(2-methylpropionate) were dissolved in 100.5 g of anisole in a round-bottom flask at room temperature with stirring to provide a monomer solution. 19.5 g anisole was charged into another round-bottom flask equipped with a condenser. The solvent in the round-bottom flask was heated up to 80° C. with stirring. The monomer solution was fed into the round-bottom flask by dropwise over 3 hours. After monomer feeding was completed, the reaction mixture was stirred for an hour at 80° C. The reaction mixture was cooled down in an ice bath and precipitated to 1500 g mixture of methyl tert-butyl ether/heptane. The solvent mixture was filtered and the polymer was dried under vacuum at 40° C. for 16 hours.

Polymer 3 (P3)

3.00 g glycidyl methacrylate, 4.28 g 2,3,4,5,6-pentafluorobenzoic acid, and 0.08 g tetrabutyl ammonium bromide were dissolved in 30.56 g dimethyl acetamide in a round-bottom flask equipped with a condenser. The mixture was heated at 80° C. for 18 hours with stirring, and subsequently allowed to cool to room temperature. The product, 2-hydroxy-3-(methacryloyloxy)propyl 2,3,4,5,6-pentafluorobenzoate (HMPPFB), was extracted using a combination of ethyl acetate and water, the solvent was removed by evaporation, and the product was dried under vacuum at 40° C. for 16 hours.

3.34 g 2-hydroxyethyl methacrylate (HEMA), 6.57 g tert-butyl methacrylate (tBMA), 10.91 g HMPPFB and 2.37 g dimethyl 2,2'-azobis(2-methylpropionate) were dissolved in 100.5 g of anisole in a round-bottom flask at room temperature with stirring to provide a monomer solution. 19.5 g anisole was charged into another round-bottom flask equipped with a condenser. The solvent in the round-bottom flask was heated up to 80° C. with stirring. The monomer solution was fed into the round-bottom flask by dropwise over 3 hours. After monomer feeding was completed, the reaction mixture was stirred for an hour at 80° C. The reaction mixture was cooled down in ice bath and precipitated to 1500 g mixture of methyl tert-butyl ether/heptane. The solvent mixture was filtered, and the polymer was dried under vacuum at 40° C. for 16 hours.

Polymer 4 (P4)

2-(methacryloyloxy)ethyl 2,3,5-triiodobenzoate (METIB) was prepared according to literature procedure (*Biomolecules,* 2003, 4, 793-798). 3.34 g 2-hydroxyethyl methacrylate (HEMA), 6.57 g tert-butyl methacrylate (tBMA), 18.87 g METIB and 2.37 g dimethyl 2,2'-azobis(2-methylpropionate) were dissolved in 100.5 g of anisole in a round-bottom flask at room temperature with stirring to provide a monomer solution. 19.5 g anisole was charged into another round-bottom flask equipped with a condenser. The solvent in the round-bottom flask was heated up to 80° C. with stirring. The monomer solution was fed into the round-bottom flask by dropwise over 3 hours. After monomer feeding was completed, the reaction mixture was stirred for an hour at 80° C. The reaction mixture was cooled down in an ice bath and precipitated to 1500 g mixture of methyl tert-butyl ether/heptane. The solvent mixture was filtered, and the polymer was dried under vacuum at 40° C. for 16 hours.

Polymer 5 (P5)

4.58 g 4-hydroxyphenyl methacrylate (HQMA), 6.57 g tert-butyl methacrylate (tBMA), 18.87 g METIB and 2.37 g dimethyl 2,2'-azobis(2-methylpropionate) were dissolved in 100.5 g of anisole in a round-bottom flask at room temperature with stirring to provide a monomer solution. The synthesis is then followed in accordance with preparation of Polymer 4.

Polymer 6 (P6)

2-(methacryloyloxy)ethyl 2,3,5-triiodobenzoate (METIB) was prepared according to literature procedure above. 3.65 g glycidyl methacrylate (GMA), 6.57 g tert-butyl methacrylate (tBMA), 18.87 g METIB and 2.37 g dimethyl 2,2'-azobis(2-methylpropionate) were dissolved in 100.5 g of anisole in a round-bottom flask at room temperature with stirring to provide a monomer solution. The synthesis is then followed in accordance with preparation of Polymer 4.

Polymer 7 (P7)

2-(methacryloyloxy)ethyl 2,3,5-triiodobenzoate (METIB) was prepared according to literature procedure above. 4.79 g 6-hydroxyhexyl methacrylate (HHMA), 6.57 g tert-butyl methacrylate (tBMA), 18.87 g METIB and 2.37 g dimethyl 2,2'-azobis(2-methylpropionate) were dissolved in 100.5 g of anisole in a round-bottom flask at room temperature with stirring to provide a monomer solution. The synthesis is then followed in accordance with preparation of Polymer 4.

Polymer 8 (P8)

2-(methacryloyloxy)ethyl 2,3,5-triiodobenzoate (METIB) was prepared according to literature procedure above. 3.34 g 2-hydroxyethyl methacrylate (HEMA), 7.78 g 1-methylcyclopentyl methacrylate (MCPMA), 18.87 g METIB and 2.37 g dimethyl 2,2'-azobis(2-methylpropionate) were dissolved in 100.5 g of anisole in a round-bottom flask at room temperature with stirring to provide a monomer solution. The synthesis is then followed in accordance with preparation of Polymer 4.

Polymer 9 (P9)

3.34 g 2-hydroxyethyl methacrylate (HEMA), 9.07 g 1-ethylcyclohexyl methacrylate (ECHMA), 18.87 g METIB and 2.37 g dimethyl 2,2'-azobis(2-methylpropionate) were dissolved in 100.5 g of anisole in a round-bottom flask at room temperature with stirring to provide a monomer solution. The synthesis is then followed in accordance with preparation of Polymer 4.

Polymer 10 (P10)

3.34 g 2-hydroxyethyl methacrylate (HEMA), 12.12 g 2-isopropyladamantan-2-yl methacrylate (iPAMA), 18.87 g METIB and 2.37 g dimethyl 2,2'-azobis(2-methylpropionate) were dissolved in 100.5 g of anisole in a round-bottom flask at room temperature with stirring to provide a monomer solution. The synthesis is then followed in accordance with preparation of Polymer 4.

TABLE 1

| | | |
|---|---|---|
| Polymer 1 P1 | p(HEMA/tBMA/BDIPHPM | 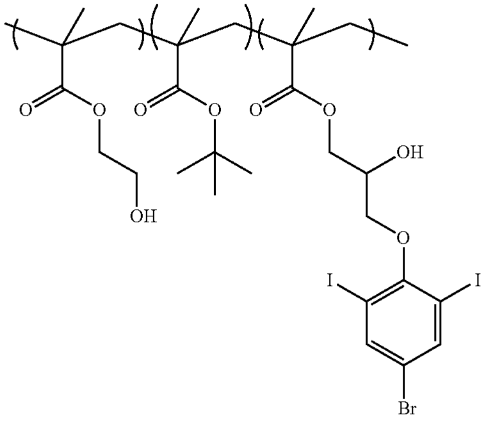 |
| Polymer 2 P2 | p(HEMA/tBMA/FDIPHPM) | 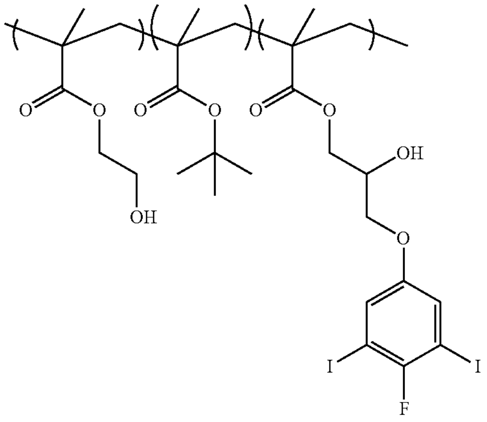 |

TABLE 1-continued
| | | |
|---|---|---|
| Polymer 3 P3 | p(HEMA/tBMA/HMPPFB) | 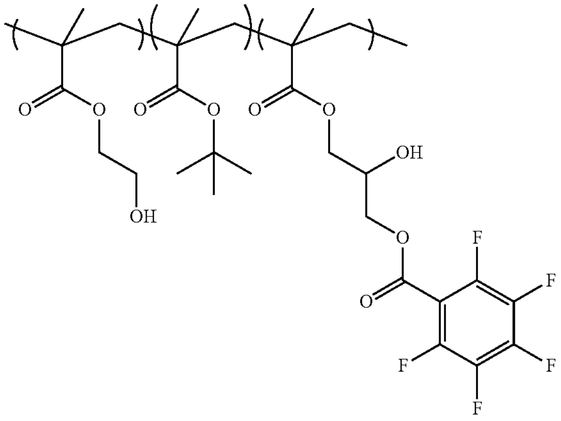 |
| Polymer 4 P4 | p(HEMA/tBMA/HMPPFB) | 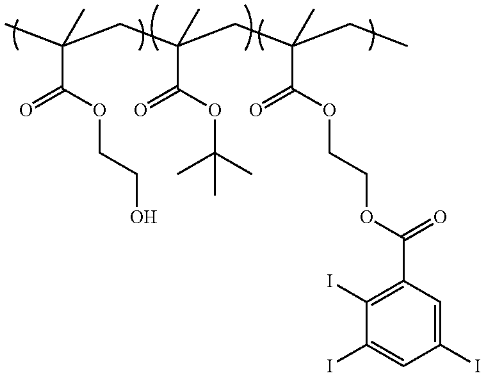 |
| Polymer 5 P5 | p(HQMA/tBMA/METIB) | 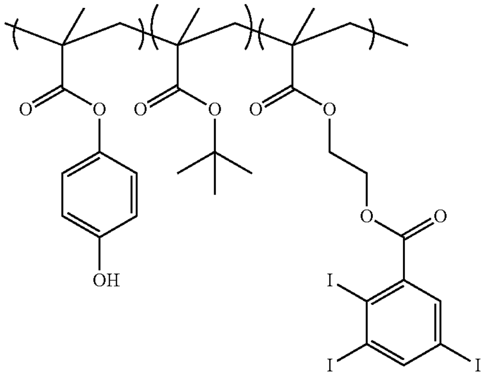 |
| Polymer 6 P6 | p(GMA/tBMA/METIB) | 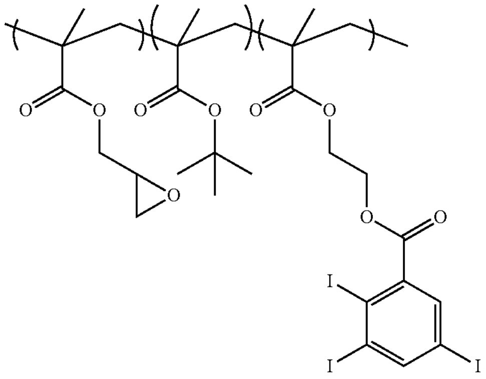 |

TABLE 1-continued

| | | |
|---|---|---|
| Polymer 7 P7 | p(HHMA/tBMA/METIB) | 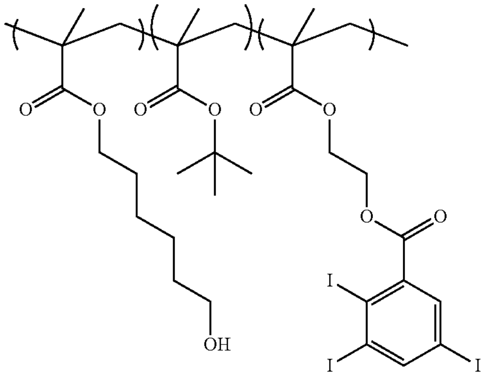 |
| Polymer 8 P8 | p(HEMA/MCPMA/METIB) | 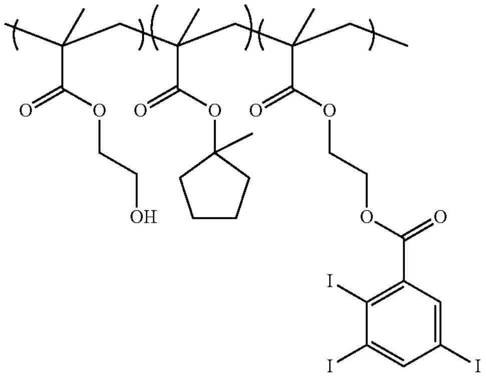 |
| Polymer 9 P9 | p(HEMA/ECHMA/METIB) | 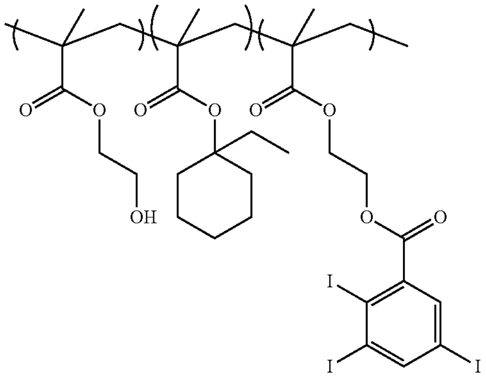 |
| Polymer 10 P10 | p(HEMA/iPAMA/METIB) | 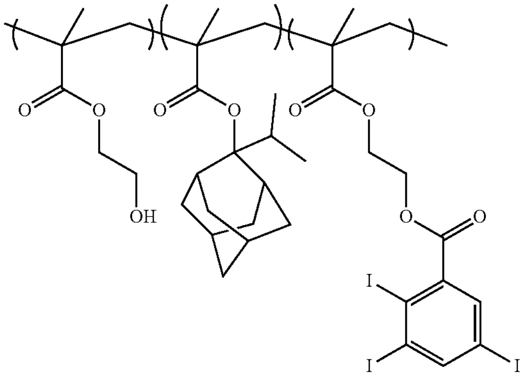 |

Comparative Polymer 1 (P11)

17.45 g 2-hydroxyethyl methacrylate (HEMA), 17.45 g methyl methacrylate (MMA), and 2.47 g dimethyl 2,2'-azobis(2-methylpropionate) were dissolved in 40.0 g propylene glycol monomethyl ether acetate in a 250 mL round-bottom flask with stirring and placed in an ice bath to cool the monomer solution to about 0° C. 80 g propylene glycol monomethyl ether acetate was charged into another 3-neck round-bottom flask equipped with a condenser. The solvent in the round-bottom flask was heated up to 80° C. with stirring. The monomer solution was fed into the round-bottom flask by dropwise over 60 minutes. Thereafter, the reaction mixture was stirred for an hour at 80° C. The reaction mixture was cooled down to room temperature. The resulting polymer solution was precipitated with isopropyl alcohol (10 times excess of reaction mixture), filtered and vacuum dried, to provide resulting polymer.

Comparative Polymer 2 (P12)

13.08 g 2-hydroxyethyl methacrylate (HEMA), 16.92 g 1-methylcyclopentyl methacrylate (MCPMA), and 4.17 g dimethyl 2,2'-azobis(2-methylpropionate) were dissolved in 45.0 g of propylene glycol monomethyl ether acetate in a round-bottom flask at room temperature with stirring to provide a monomer solution. 25.0 g propylene glycol monomethyl ether acetate was charged into another round-bottom flask equipped with a condenser. The solvent in the round-bottom flask was heated up to 80° C. with stirring. The monomer solution was fed into the round-bottom flask by dropwise over 3 hours. After monomer feeding was completed, the reaction mixture was stirred for an hour at 80° C. The reaction mixture was cooled down in an ice bath and precipitated to 1000 g mixture of methyl tert-butyl ether/heptane. The solvent mixture was filtered and the polymer was dried under vacuum at 40° C. for 16 hours.

Comparative Polymer 3 (P13)

2.38 g 2-hydroxyethyl methacrylate (HEMA), 5.21 g n-butyl methacrylate (nBMA), 22.41 g METIB and 1.90 g dimethyl 2,2'-azobis(2-methylpropionate) were dissolved in 100.5 g of anisole in a round-bottom flask at room temperature with stirring to provide a monomer solution.

TABLE 2

| | | |
|---|---|---|
| Comparative polymer 1 (P11) | p(HEMA/MMA) | 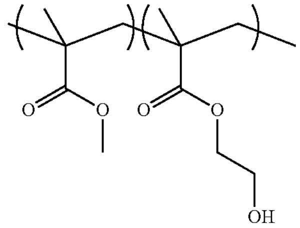 |
| Comparative polymer 2 (P12) | p(HEMA/MCPMA) | 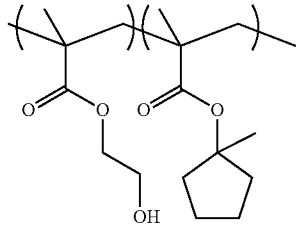 |
| Comparative polymer 3 (P13) | p(HEMA/nBMA/METIB) | 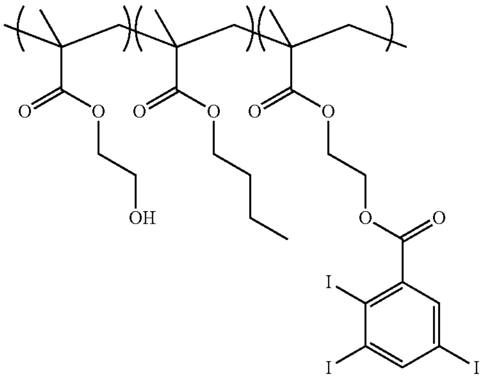 |
| Crosslinker (C1) | 1,3,4,6-tetrakis(methoxymethyl) tetrahydroimidazole [4,5-d]imidazole-2,5-(1H,3H)-dione | 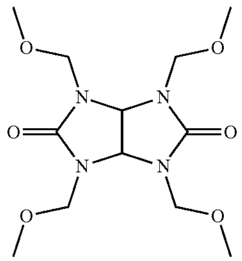 |

TABLE 2-continued

| | | |
|---|---|---|
| Acid catalyst (A1) | 2,4,6-trimethylpyridinium trifluoromethanesulfonate salt | 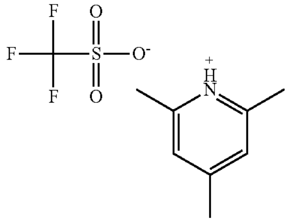 |
| Solvent (S1) | propylene glycol monomethyl ether acetate | 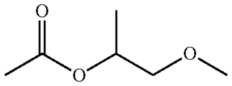 |
| Solvent (S2) | methyl-2-hydroxy isobutyrate | 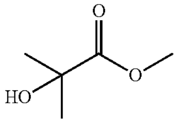 |
| Solvent (S3) | gamma-butyrolactone | 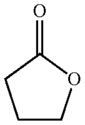 |

Example Compositions

Example 1: 0.24 g of P1, 0.05 g of C1, and 0.01 g of A1 were dissolved in 69.8 g of propylene glycol monomethyl ether acetate, 27.9 g of methyl-2-hydroxy isobutyrate, and 2.0 g of gamma-butyrolactone solvent mixture to obtain the solution. Then, the solution was filtered through PTFE 0.45 μm membrane filter.

Example 2 to Example 10. The same procedure in accordance with Example 1 is used for the preparation of the compositions Example 2 to 10 with the exception that for each of Examples 2 to 10, 0.24 g of the polymer P2 to P10 is used, respectively.

Comparative Examples 1, 2, and 3. The same procedure in accordance with Example 1 is used for the preparation of Comparative Examples 1, 2 and 3 with the exception that for each of Comparative Examples 1, 2, and 3, 0.24 g of the Comparative polymer P1, P2, and P3 is used, respectively.

TABLE 3

| EUV absorbance coefficient | |
|---|---|
| Underlayer composition | Calculated EUV abs. coefficient ($\mu m^{-1}$, after ultra-thin film formation) |
| Example 1 | 8.9 |
| Example 2 | 9.7 |
| Example 3 | 7.7 |
| Example 4 | 10.5 |
| Example 5 | 10.2 |
| Example 6 | 10.4 |
| Example 7 | 10.1 |
| Example 8 | 10.5 |
| Example 9 | 10.5 |
| Example 10 | 10.5 |
| Comp. example 1 | 6.5 |
| Comp. example 2 | 6.5 |
| Comp. example 3 | 10.7 |

Film Strip Evaluation

A prepared composition was spin coated on a silicon wafer at 1500 rpm using a spinner and the wafer was heated at 205° C. for 60 seconds on a hot plate to form a thin film (film thickness of 5 nm). Initial film thickness was measured with a Therma-Wave OptiProbe™ metrology tool. The thin film was then exposed to 30 mL of PGMEA for 90 seconds, spun dried at 4000 rpm for 60 seconds and post baked at 110° C. for 60 seconds on a hot plate. The Δstrip was calculated (thickness of an exposed & post exposed baked film—thickness of an initially coated film) and is reported in Table 4. The difference in film thickness before and after contact with the PGMEA remover is measured to determine the percentage of film thickness remaining on the wafer (% Film Remaining). This value is indicative of the degree of crosslinking of the polymeric layer with the more positive values indicating an increase in crosslink density.

TABLE 4

| Underlayer composition | Δstrip (Å) |
|---|---|
| Example 1 | −0.5 |
| Example 2 | −0.4 |
| Example 3 | −0.2 |
| Example 4 | −0.6 |
| Example 5 | −0.4 |
| Example 6 | −0.7 |
| Example 7 | −0.9 |
| Example 8 | −0.5 |
| Example 9 | −0.7 |
| Example 10 | −0.5 |
| Comp. example 1 | −0.4 |
| Comp. example 2 | −0.7 |
| Comp. example 3 | −1.2 |

Adhesion Evaluation

A prepared composition was spin coated on a silicon wafer at 1500 rpm using a spinner and the wafer was heated at 205° C. for 60 seconds on a hot plate to form a thin film (film thickness of 5 nm). An inorganic resist solution (di-n-butyltin diacetate (CAS 1067-33-0, purchased from Alfa-Aesar) in n-propanol) was applied on the underlayer film with a spinner and heated on a hot plate at 150° C. for 60 seconds (a film thickness of 20 nm). A tape was pressed onto the inorganic resist and then rapidly stripped. As indicated in Table 5, Examples 1 to 10 exhibit no observable peeling whereas Comparative Examples 1 and 3 exhibit observable partial peeling and near complete peeling, respectively. In particular, the observed adhesiveness to the substrate by Example Compositions 4 and 8-10, each of which includes a polymer with an acid-generating repeating unit, is shown to be greater than the composition of Comparative Example 3 with no acid-generating repeating unit.

TABLE 5

| Underlayer composition | Adhesion results |
|---|---|
| Example 1 | No peeling |
| Example 2 | No peeling |
| Example 3 | No peeling |
| Example 4 | No peeling |
| Example 5 | No peeling |
| Example 6 | No peeling |
| Example 7 | No peeling |
| Example 8 | No peeling |
| Example 9 | No peeling |
| Example 10 | No peeling |
| Comp. example 1 | Partial peeling |
| Comp. example 2 | No peeling |
| Comp. example 3 | Peeling |

Resist Pattern Formation Evaluation

A prepared underlayer composition was spin coated on a silicon wafer at 1500 rpm using a spinner and the wafer was heated at 205° C. for 60 seconds on a hot plate to form a thin film (film thickness of 5 nm). Onto the underlayer film, an inorganic resist solution (di-n-butyltin diacetate (CAS 1067-33-0, purchased from Alfa-Aesar) in n-propanol) was applied with a spinner and heated on a hot plate to form an inorganic resist film (a film thickness of 40 nm). The dose of operation for 40 nm pitch L/S patterning resist on underlayer examples were evaluated by direct E-beam writing using E-beam lithography tools (JBX 9300FS from JEOL 100 keV). The wafers were post-exposure baked at 60° C. for 60 seconds, developed with PGMEA for 30 seconds, and hard baked at 100° C. for 5 min. The patterned wafers were inspected by HITACHI S9380 CD-SEM and reported in Table 6.

TABLE 6

| Underlayer film-forming composition | $E_{op}$ (μC/cm$^2$) | Pattern collapse defect performance |
|---|---|---|
| Example 3 | 920 | No collapse |
| Example 4 | 800 | No collapse |
| Example 5 | 820 | No collapse |
| Example 8 | 800 | No collapse |
| Comparative example 1 | 980 | No collapse |
| Comparative example 3 | 800 | Severe collapse |

In particular, the observed pattern formation or stability of Example Compositions 4 and 8, each of which includes a polymer with an acid-generating repeating unit, is shown to be greater than the Comparative Example 3 of similar composition except with no acid-generating repeating unit.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A composition comprising a polymer, the polymer comprising:

repeating units derived from a monomer of Formula A1, Formula A2, or Formula A3, Formula A1

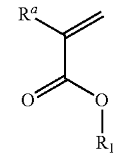

Formula A2

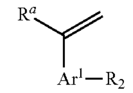

Formula A3

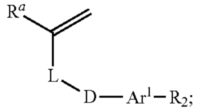

repeating units derived from a monomer of Formula B1, Formula B2, Formula B3, or Formula B4, Formula B1

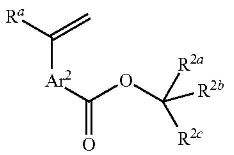

Formula B2

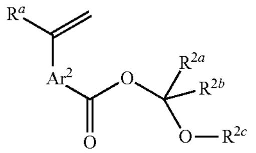

Formula B3

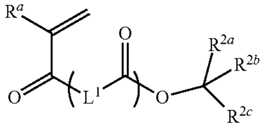

Formula B4

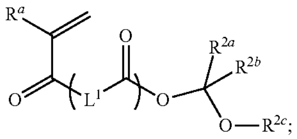

and

Formula B3 Formula B4;

repeating units derived from a monomer of Formula C1 or Formula C2,

Formula C1

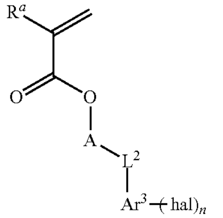

Formula C2

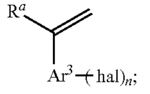

wherein $Ar^1$, $Ar^2$, and $Ar^3$ are each independently an aromatic group;

$R^1$ is a $C_{1-20}$ alkyl alcohol, a $C_{1-20}$ cycloalkyl alcohol, an epoxy with 3 to 12 carbons, or a $C_{5-20}$ aromatic group with one to six ring carbons substituted with a hydroxy, a glycidyl group, a $C_{1-10}$ alkyl alcohol, or an epoxy with 3 to 12 carbons;

$R^2$ is $R^1$ or —OH;

each of $R^{2a}$, $R^{2b}$, and $R^{2c}$ is independently an unsubstituted or substituted $C_{1-20}$ alkyl, an unsubstituted or substituted $C_{3-20}$ cycloalkyl, an unsubstituted or substituted $C_{3-20}$ heterocycloalkyl, or optionally, $R^{2a}$ can join with $R^{2b}$ to form a ring, or $R^{2a}$ can join with $R^{2c}$ of Formulae B2 or B4 to form a ring, or one of $R^{2a}$, $R^{2b}$, and $R^{2c}$ is hydrogen;

L is an unsubstituted or substituted $C_{1-8}$ alkylene group or an unsubstituted or substituted $C_{2-8}$ heteroalkylene group;

$L^1$ is an unsubstituted or substituted $C_{1-8}$ alkylene group, an unsubstituted or substituted $C_{2-8}$ heteroalkylene group, an unsubstituted or substituted $C_{6-10}$ arylene group, or an unsubstituted or substituted $C_{3-10}$ heteroarylene group;

$L^2$ is a single bond, —O—, —O(C═O)—, —(C═O)O—, —O($SO_2$)—, —($SO_2$)O—, —NH($SO_2$)—, —($SO_2$)NH—, —NH(C═O)—, —(C═O)NH—, —$SO_2$—, or —SO—;

D is a single bond, —O—, —OC(O)—, —NH(C═O)—, or —(C═O)NH—;

A is an unsubstituted or substituted $C_{1-16}$ alkylene group, an unsubstituted or substituted $C_{2-16}$ heteroalkylene group, an unsubstituted or substituted $C_{6-20}$ arylene group, an unsubstituted or substituted $C_{3-20}$ heteroarylene group;

each hal is independently a halogen atom or a $C_{1-4}$ haloalkyl;

$R^a$ is a hydrogen atom, a halogen atom, a $C_{1-4}$ alkyl, or a $C_{1-4}$ haloalkyl;

m is 0 or 1, and n is 1 to 12;

a crosslinker;

an acid catalyst; and a solvent wherein the composition is a photoresist underlayer composition.

2. The composition of claim 1, wherein $Ar^1$ and $Ar^3$ are each independently a phenyl, naphthyl, anthracenyl, pyrenyl, pyridinyl, quinolinyl, biphenyl, fluorenyl, or carbazoyl, each of which is optionally further substituted at a ring carbon; and $Ar^2$ is a phenylene, naphthylene, anthracenylene, pyrenylene, pyridinylene, quinolinylene, biphenylene, fluorenylene, or carbazoylene, each of which is optionally further substituted at a ring carbon.

3. The composition of claim 1, wherein $Ar^1$ and $Ar^3$ are each independently a phenyl, naphthyl, biphenyl, or fluorenyl, each of which is optionally further substituted at a ring carbon;

$Ar^2$ is a phenylene, naphthylene, biphenylene, or fluorenylene, each of which is optionally further substituted at a ring carbon; and hal is F, Br, I, or if n is 2 or more a combination thereof.

4. The composition of claim 1, wherein $R^1$ is a $C_{1-10}$ alkyl alcohol, an epoxy with 3 to 8 carbons, or a $C_{5-10}$ aromatic group with one to four ring carbons substituted with a hydroxy or a glycidyl group;

each of $R^{2a}$, $R^{2b}$, and $R^{2c}$ is independently an unsubstituted or substituted $C_{1-8}$ alkyl, and optionally, $R^{2a}$ joins with $R^{2b}$ to form a ring, or $R^{2a}$ joins with $R^{2c}$ of Formulae B1 or B4 to form a ring;

$L^1$ is an unsubstituted or substituted $C_{1-8}$ alkylene group or an unsubstituted or substituted $C_{2-8}$ heteroalkylene group;

$L^2$ is a single bond, —O—, —O(C═O)—, or —NH(C═O)—;

A is an unsubstituted or substituted $C_{2-8}$ alkylene group, an unsubstituted or substituted $C_{3-8}$ heteroalkylene group.

5. The composition of claim 1, wherein the monomer of Formulae A1, A2, and A3 are represented by one or more of the following

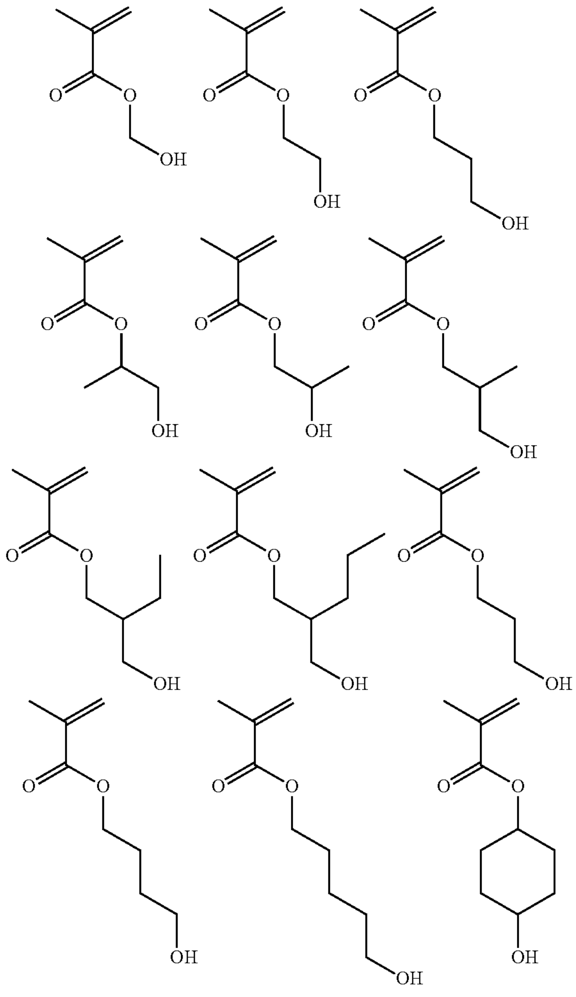

-continued
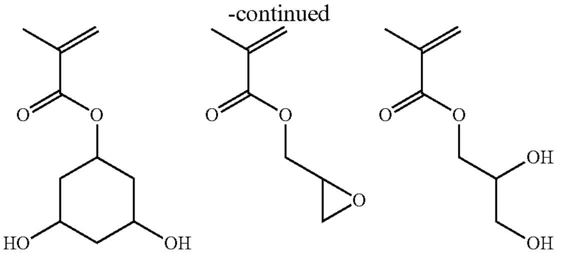
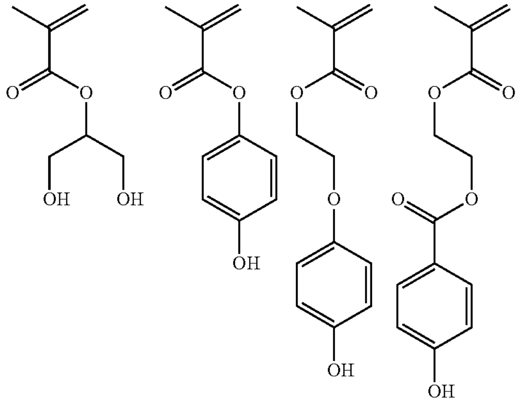
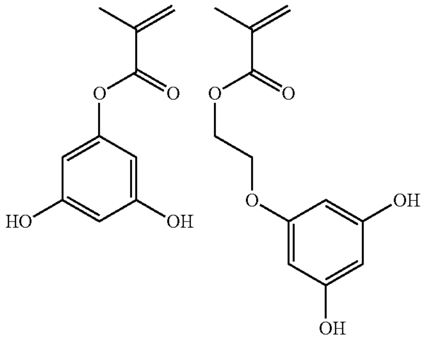
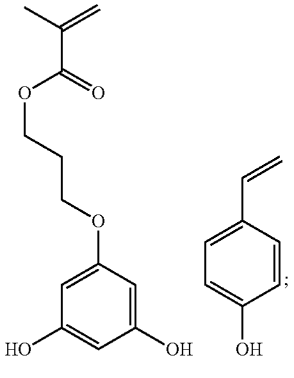
and
the monomer of Formulae B1 and B3 are represented by one or more of the following
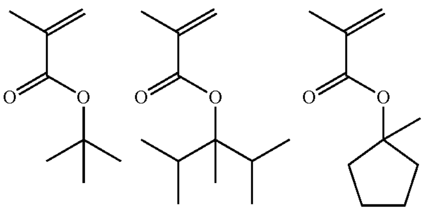
-continued
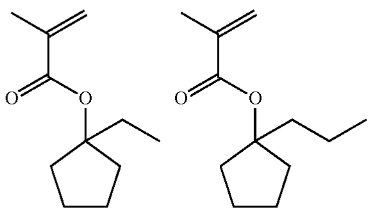
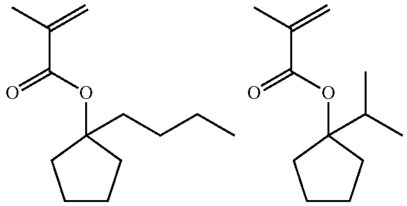
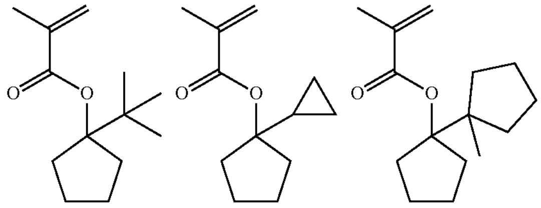
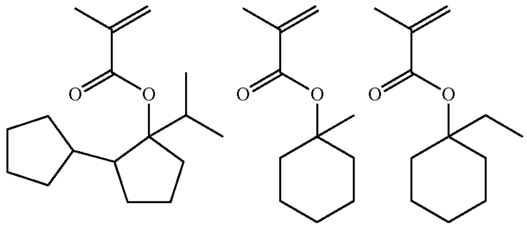
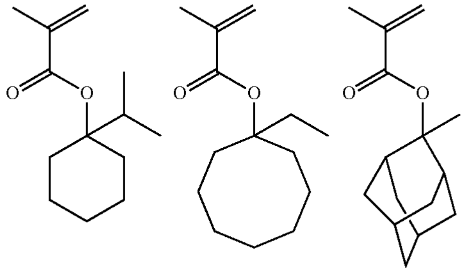
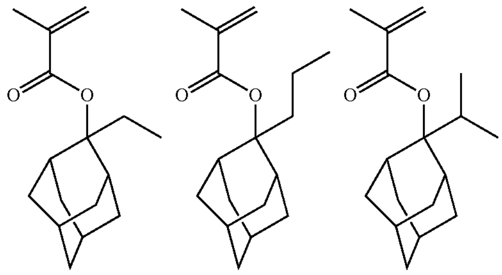
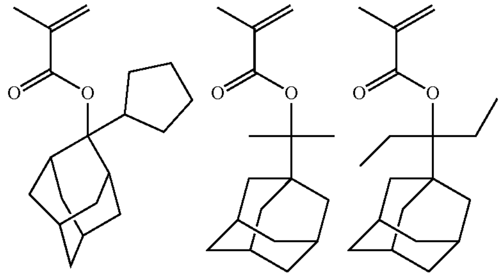

-continued
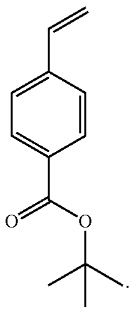
6. The composition of claim 1, wherein the monomer of Formulae C1 and C2 are represented by one or more of the following
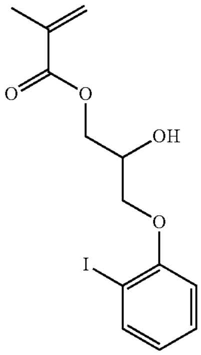
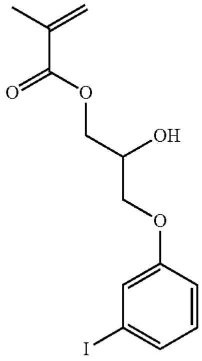
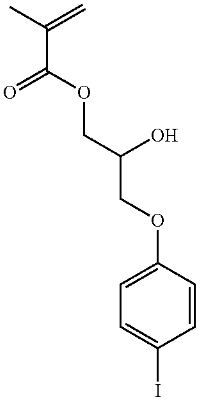
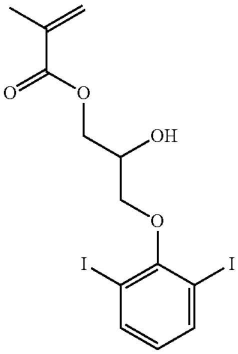
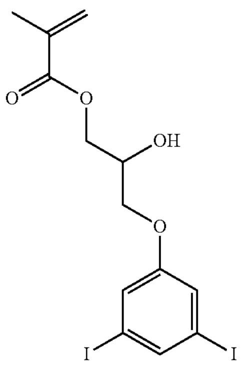
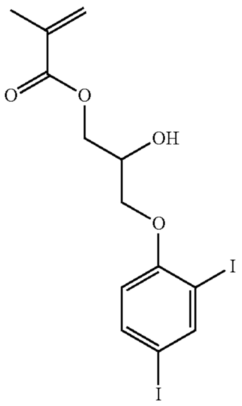
-continued
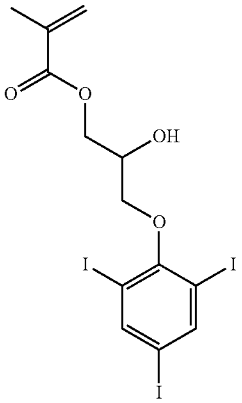
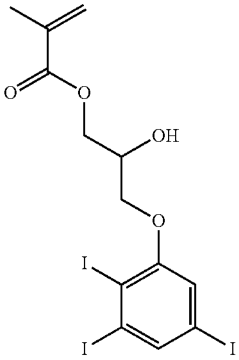
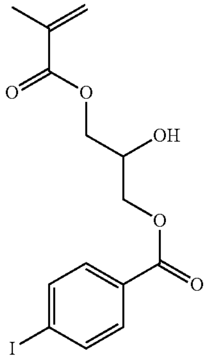
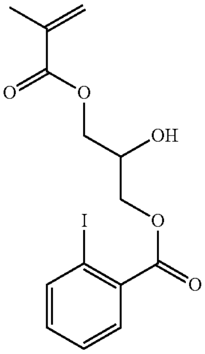
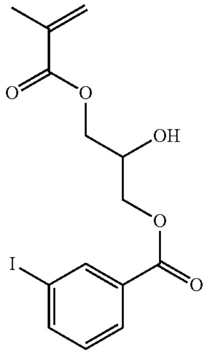
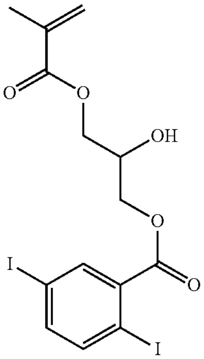
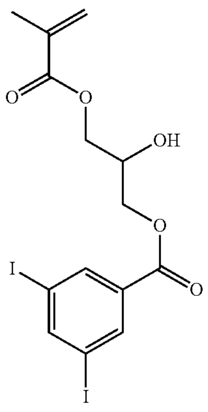
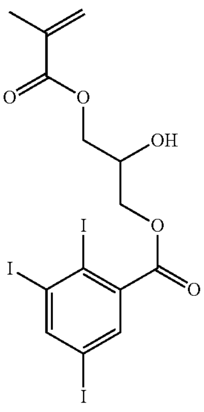

-continued
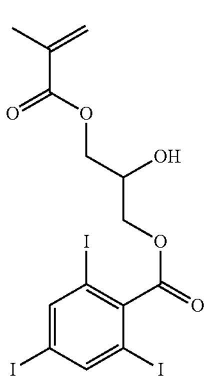
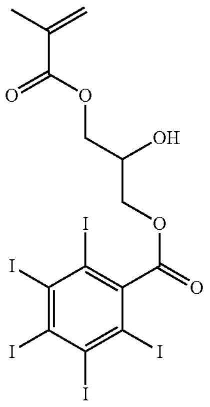
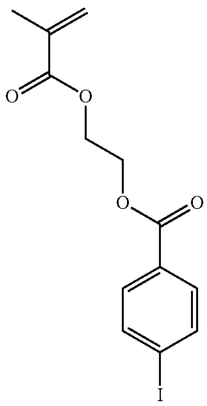
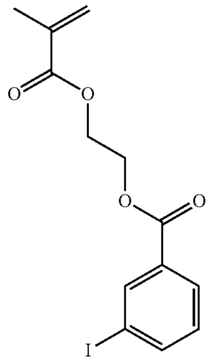
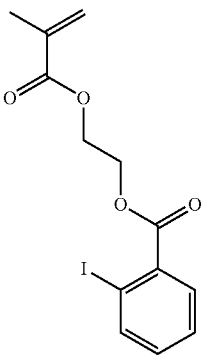
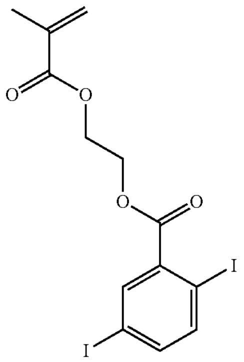
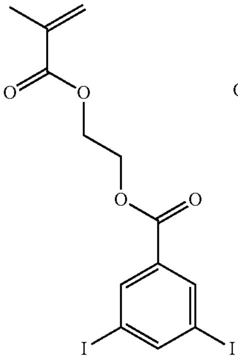
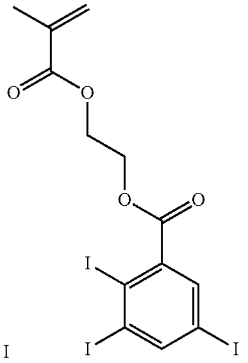
-continued
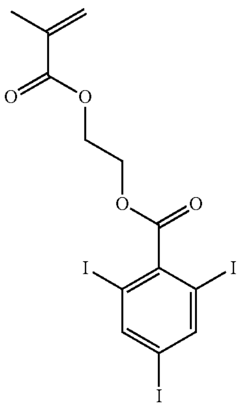
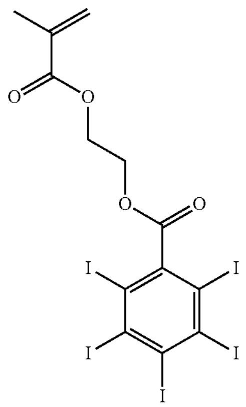
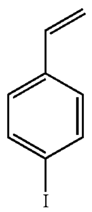
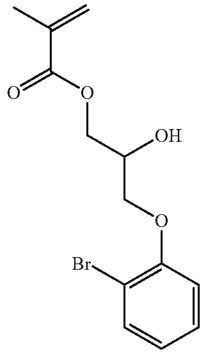
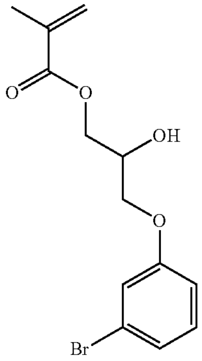
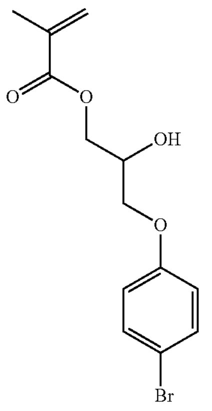
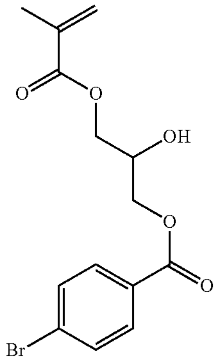
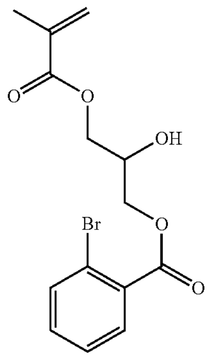
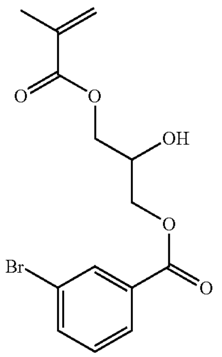

-continued
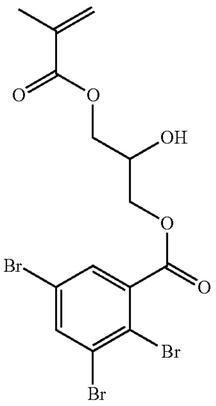
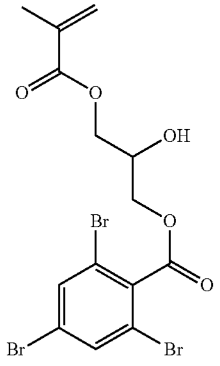
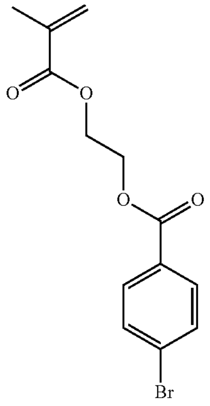
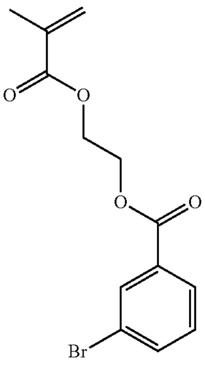
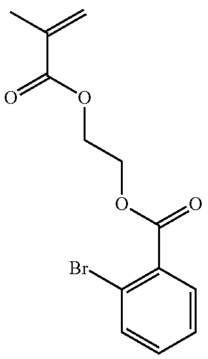
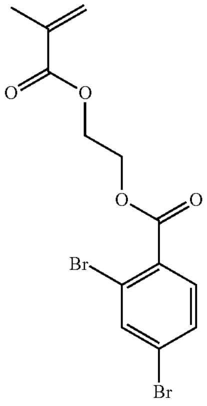
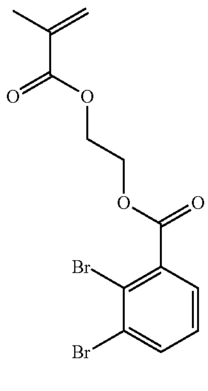
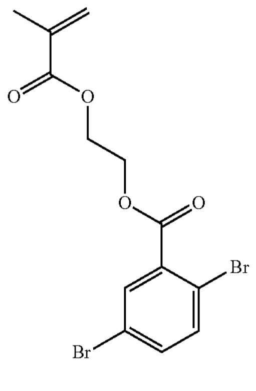
-continued
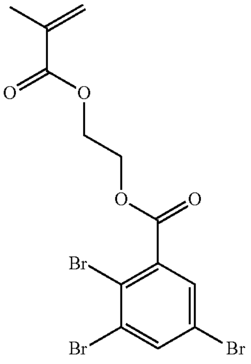
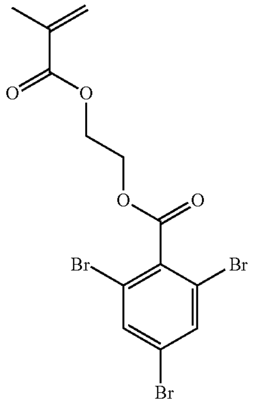
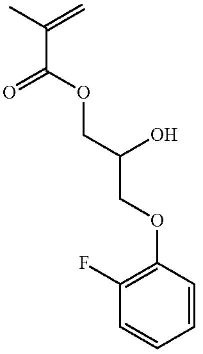
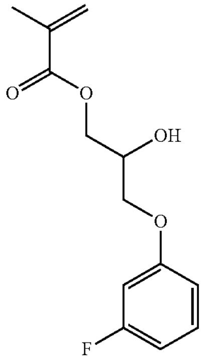
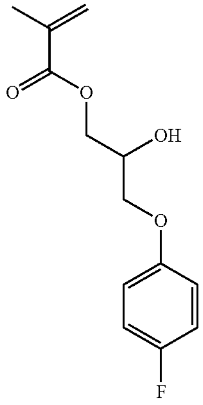
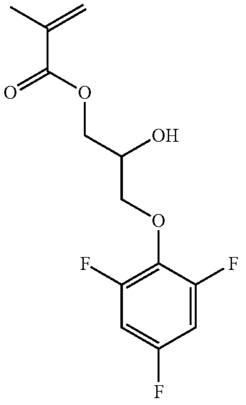
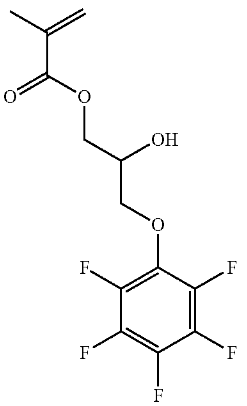
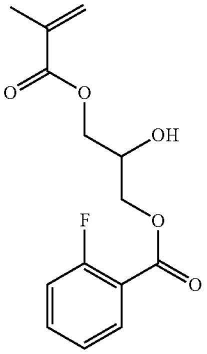

-continued
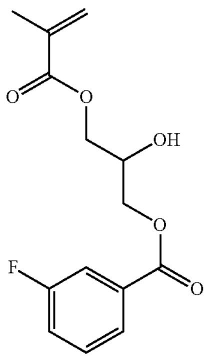
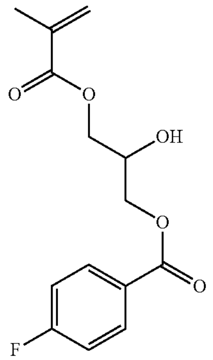
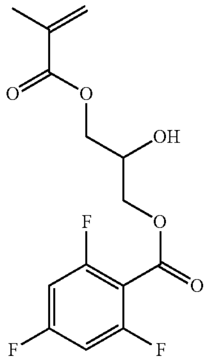
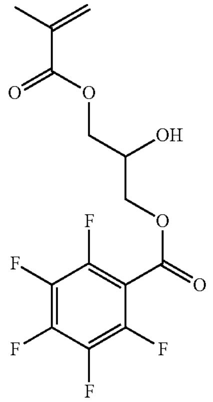
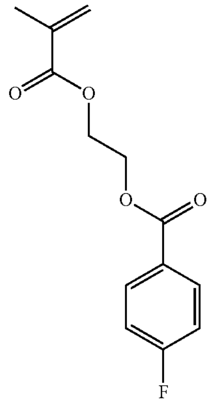
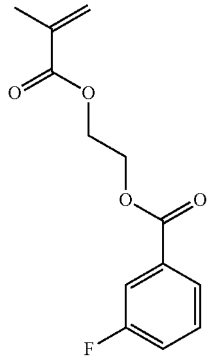
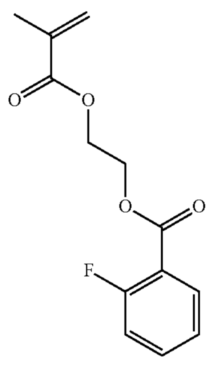
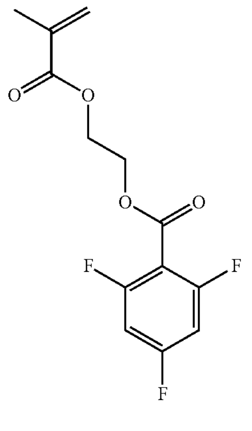
-continued
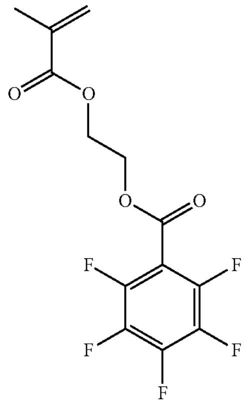
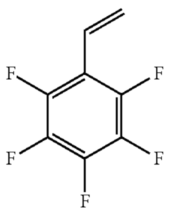
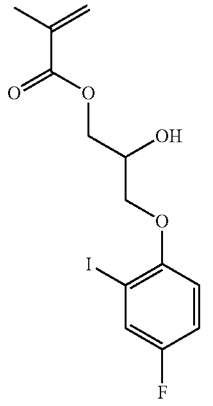
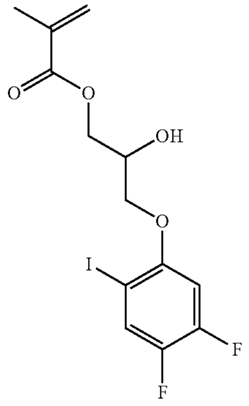
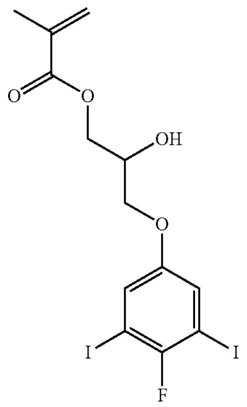
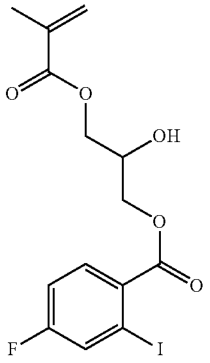
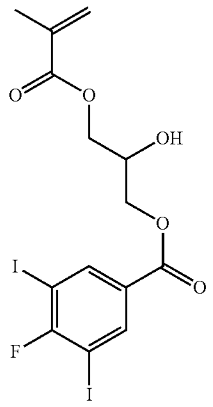
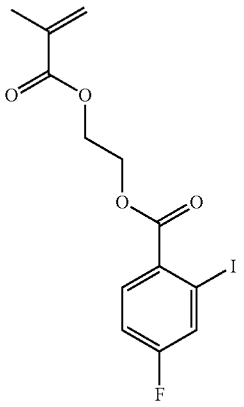

-continued

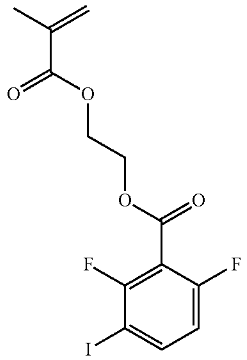

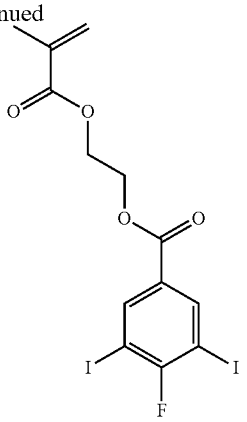

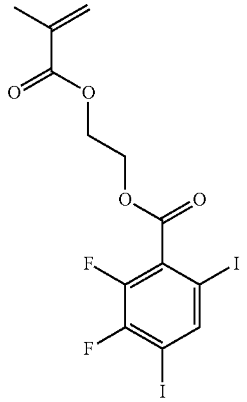

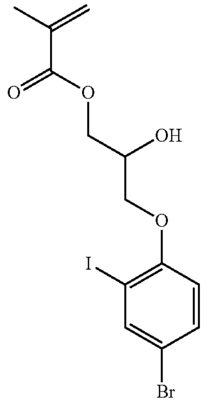

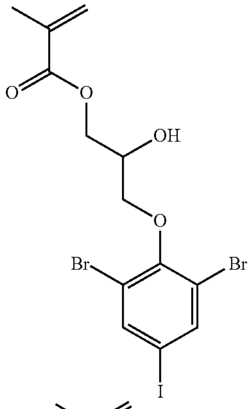

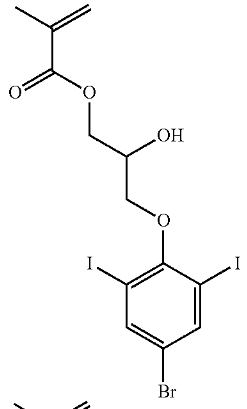

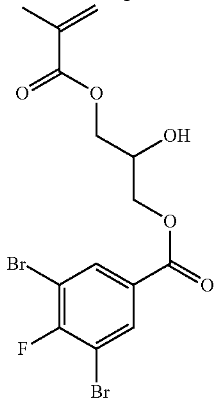

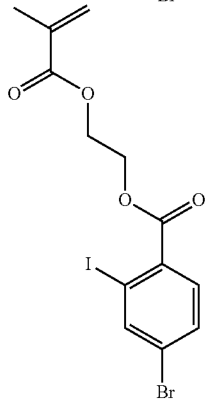

-continued

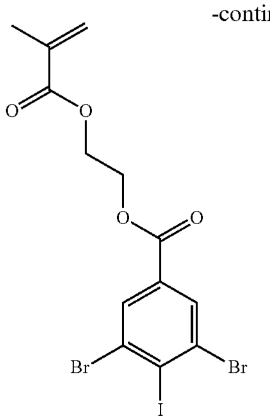

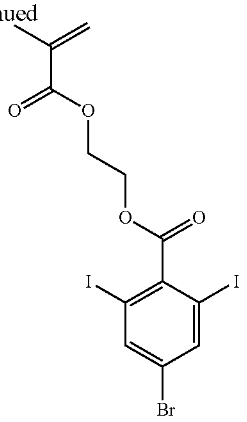

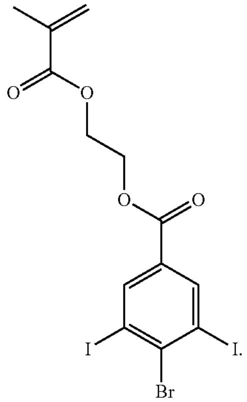 [SMILES: C=C(C)C(=O)OCCOC(=O)c1cc(I)c(Br)c(I)c1]

7. The composition of claim 1 wherein the composition does not include a photoacid generator.

8. A coated substrate, comprising:

a substrate;

a photoresist underlayer formed from the composition of claim 1 disposed on the substrate; and a photoresist layer disposed on the photoresist underlayer.

9. The coated substrate of claim 8, wherein the photoresist layer is a metal-containing photoresist layer.

10. A method of forming a pattern, the method comprising:

providing a photoresist underlayer over a substrate, wherein the photoresist underlayer is formed by applying the composition of claim 1 to the substrate, removing the solvent, and curing;

forming a photoresist layer over the photoresist underlayer;

patterning the photoresist layer; and transferring a pattern from the patterned photoresist layer to the photoresist underlayer.

11. The method of claim 10 wherein the cure is a thermal cure.

12. The method of claim 10 wherein the cure occurs before applying the photoresist layer.

* * * * *